United States Patent
Suzuki et al.

(10) Patent No.: US 8,895,373 B2
(45) Date of Patent: Nov. 25, 2014

(54) METHOD FOR MANUFACTURING FLEXIBLE SEMICONDUCTOR DEVICE HAVING GATE ELECTRODE DISPOSED WITHIN AN OPENING OF A RESIN FILM

(71) Applicant: Panasonic Corporation, Osaka (JP)

(72) Inventors: Takeshi Suzuki, Osaka (JP); Kenichi Hotehama, Osaka (JP); Seiichi Nakatani, Osaka (JP); Koichi Hirano, Osaka (JP); Tatsuo Ogawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/047,225

(22) Filed: Oct. 7, 2013

(65) Prior Publication Data

US 2014/0038366 A1  Feb. 6, 2014

Related U.S. Application Data

(62) Division of application No. 13/256,457, filed as application No. PCT/JP2010/000597 on Feb. 2, 2010, now Pat. No. 8,581,247.

(30) Foreign Application Priority Data

Mar. 31, 2009  (JP) ................................. 2009-084542

(51) Int. Cl.
| | | |
|---|---|---|
| *H01L 21/00* | (2006.01) | |
| *H01L 21/84* | (2006.01) | |
| *H01L 21/302* | (2006.01) | |
| *H01L 21/461* | (2006.01) | |
| *H01L 29/66* | (2006.01) | |
| *H01L 29/786* | (2006.01) | |
| *H01L 27/12* | (2006.01) | |
| *H01L 51/00* | (2006.01) | |
| *H01L 51/05* | (2006.01) | |

(52) U.S. Cl.
CPC .... *H01L 29/66742* (2013.01); *H01L 29/66757* (2013.01); *H01L 29/78603* (2013.01); *H01L 29/78675* (2013.01); *H01L 27/1218* (2013.01); *H01L 29/7869* (2013.01); *H01L 51/0097* (2013.01); *H01L 51/0512* (2013.01)
USPC ............ 438/151; 438/149; 438/155; 438/708

(58) Field of Classification Search
None
See application file for complete search history.

(56) References Cited

U.S. PATENT DOCUMENTS

| | | |
|---|---|---|
| 5,821,138 A | 10/1998 | Yamazaki et al. |
| 8,288,778 B2 | 10/2012 | Nakatani et al. |

(Continued)

FOREIGN PATENT DOCUMENTS

| | | |
|---|---|---|
| JP | 2-65138 | 3/1990 |
| JP | 2002-49056 | 2/2002 |

(Continued)

OTHER PUBLICATIONS

International Search Report issued Mar. 9, 2010 in International (PCT) Application No. PCT/JP2010/000597.

(Continued)

*Primary Examiner* — Michael Jung
(74) *Attorney, Agent, or Firm* — Wenderoth, Lind & Ponack, L.L.P.

(57) ABSTRACT

There is provided a flexible semiconductor device. The flexible semiconductor device of the present invention comprising a support layer, a semiconductor structure portion formed on the support layer, and a resin film formed on the semiconductor structure portion. The resin film comprises an opening formed by a laser irradiation therein, and also an electroconductive member which is in contact with the surface of the semiconductor structure portion is disposed within the opening of the resin film.

8 Claims, 22 Drawing Sheets

(56) References Cited

U.S. PATENT DOCUMENTS

2009/0155963 A1    6/2009  Hawkins et al.
2009/0166612 A1*   7/2009  Cain et al. .................. 257/40

FOREIGN PATENT DOCUMENTS

| | | |
|---|---|---|
| JP | 2004-297084 | 10/2004 |
| JP | 2007-67263 | 3/2007 |
| JP | 2008-547195 | 12/2008 |
| WO | 2006/138071 | 12/2006 |
| WO | 2007/110671 | 10/2007 |
| WO | WO2007/110671 A2 * 10/2007 | ............. H01L 51/10 |
| WO | 2009/019864 | 2/2009 |
| WO | 2009/019865 | 2/2009 |

OTHER PUBLICATIONS

International Preliminary Report on Patentability and Written Opinion of the International Searching Authority (in English) issued Nov. 15, 2011 in international Application PCT/JP2010/000597.

* cited by examiner (a)

Upper
Lower (b)

(c)

(a)

(b)

(c)

(a)

(b)

(c)

(a)

(b)

(a)

(b)

(a)

(b)

(a)

(b)

(c)

(a)

(b)

(a)

(b)

100, 100', 100"

100, 100', 100"

METHOD FOR MANUFACTURING FLEXIBLE SEMICONDUCTOR DEVICE HAVING GATE ELECTRODE DISPOSED WITHIN AN OPENING OF A RESIN FILM

TECHNICAL FIELD

The present invention relates to a flexible semiconductor device with its flexibility, and also a method for manufacturing the same. In particular, the present invention relates to the flexible semiconductor device which can be used as a TFT, and also the method for manufacturing the same.

BACKGROUND OF THE INVENTION

There is a growing need for a flat-panel display as a display device of a computer with a wide spreading use of information terminals. With further advancement of informatization, there are also increasing opportunities in which information, which has been conventionally provided by paper medium, is digitized. Particularly, the needs for an electronic paper or a digital paper have been recently increasing since they are thin and light weight mobile display media which can be easily held and carried (see Patent document 1, described below).

Generally, the display medium of a flat panel display device is formed by using an element such as a liquid crystal, an organic EL (organic electroluminescence) and an electrophoresis. In such display medium, a technology which uses an active drive element (TFT element) as an image drive element has become a mainstream in order to secure a uniformity of the screen luminosity and a screen rewriting speed and so forth. In the conventional computer display device, TFT elements are formed on a glass substrate, and a liquid crystal element, an organic EL element or the like is sealed.

As the TFT elements, semiconductors including a-Si (amorphous silicon) and p-Si (polysilicon) can be mainly used. These Si semiconductors (together with metal films, as necessary) are multilayered, and also each of a source electrode, a drain electrode and a gate electrode is sequentially stacked on a substrate, which leads to an achievement of the production of the TFT element.

The conventional method of manufacturing a TFT element using Si materials includes one or more steps with a high temperature, so that there is an additional restriction that the material of the substrate should resist a high process temperature. For this reason, it is required in practice to use a heat-resisting glass as the material of the substrate. In the meanwhile, it may be possible to use a quartz substrate. However the quartz substrate is so expensive that an economical problem arises when scaling up of the display panels. Therefore, a glass substrate is generally used as a substrate for forming such TFT elements.

When the thin display panel as described above is produced by using the conventionally known glass substrate, there is, however, a possibility that such display panel has a heavy weight, lacks flexibility and breaks due to a shock if it is fallen down. These problems, which are attributable to the formation of a TFT element on a glass substrate, are so undesirable in light of the needs for a portable thin display having light weight with the advancement of informatization.

From the standpoint of obtaining a substrate having flexibility and light weight to meet the needs for a lightweight and thin display, there is developed a flexible semiconductor device wherein TFT elements are formed on a resin substrate (i.e., plastic substrate). For example, Patent document 2 (see below) discloses a technique in which a TFT element is formed on a substrate (i.e., glass substrate) by a process which is almost the same as conventional process, and subsequently the TFT element is peeled from the glass substrate and then transferred onto a resin substrate (i.e., plastic substrate). In this technique, a TFT element is formed on a glass substrate and the TFT element together with the glass substrate is adhered to a resin substrate via a sealing layer (e.g., an acrylic resin layer), and subsequently the glass substrate is finally peeled thereoff. As a result, the TFT element can be transferred onto the resin substrate.

In the method for manufacturing a TFT element using such transference process, there is, however, a problem in the peeling step of the substrate (i.e., glass substrate). In other words, it is necessary to perform an additional treatment to decrease the adhesion between the substrate and the TFT element upon peeling the substrate from the resin substrate. Alternatively it is necessary to perform an additional treatment to form a peel layer between the substrate and the TFT element and to physically or chemically remove a peel layer afterward. These additional treatments make the process complicated, so that another problem concerning productivity is caused.

PATENT DOCUMENTS

[Patent document 1] Japanese Unexamined Patent Publication (Kokai) No. 2007-67263; and
[Patent document 2] Japanese Unexamined Patent Publication (Kokai) No. 2004-297084.

As for the production of the flexible semiconductor device, it is considered to directly form a TFT element on the resin board (i.e., plastic plate), not transferring the TFT element onto the resin board. In this case, a peeling step (or removing step) of the support (i.e., glass substrate) after the transfer becomes unnecessary, and thus a flexible semiconductor device can be simply and easily manufactured.

However, since the resin board made of the acrylic resin or the like has a low heat resistance, the process temperature is restricted to be kept as low as possible upon producing the TFT elements. Therefore, the TFT elements that are directly formed on the resin board have concerns about the TFT performance, as compared with the TFT elements that are formed through the transference process.

For example, it is desirable to apply a heat treatment to the semiconductor material in order to improve the semiconductor properties (e.g., mobility). However, in the case where the TFT element is directly formed on the resin board, it is difficult to adopt such heat treatment due to the restricted process temperature. Moreover, in order to decrease a gate voltage, it is desirable to use an inorganic oxide with not only a high dielectric strength voltage, but also its thinness as a gate insulating film and also a high dielectric constant. However, those inorganic oxides have such a problem to be improved in the production technology thereof that it is not easy to perform a machining (e.g., laser machining) due to the fact that the inorganic oxides are densified and have chemical stability. In particular, such problem becomes significant when it comes to the flexible semiconductor device for a large sized screen.

SUMMARY OF THE INVENTION

The inventors of the present invention tried to solve such problems not by following up the conventional way, but by focusing on a new way. The present invention has been accomplished in view of the above matters, and a main object of the present invention is to provide a method for manufacturing a flexible semiconductor device which is excellent in productivity and thereby a flexible semiconductor device with a high performance is also provided.

Means for Solving the Problem

In order to solve the above-mentioned problems, the present invention provides a method for manufacturing a flexible semiconductor device comprising the steps of:

(i) forming a semiconductor structure portion comprising a semiconductor layer on a metal foil (or a support layer);

(ii) forming a resin film on the metal foil such that the semiconductor structure portion is covered with the resin film;

(iii) irradiating the resin film with a laser, and thereby forming an opening in the resin film; and (iv) forming an electroconductive member (electrically-conductive member) such that it comes into contact with an exposed surface of the semiconductor structure portion, said exposed surface being exposed through the opening of the resin film, wherein the laser irradiation of the step (iii) forms the opening in the resin film, while subjecting the semiconductor structure portion to a heat treatment.

For one thing, the manufacturing method of the flexible semiconductor device according to the present invention is characterized in that the opening of the resin film is formed by the laser irradiation during the above-mentioned steps (i) to (iv), and also the surface of the semiconductor structure portion is subjected to a heat treatment upon such formation of the opening in the resin film. It is preferred that the semiconductor structure portion is subjected to an annealing treatment upon the formation of the opening in the resin film. It is more preferred that the film quality or property of the semiconductor structure portion is modified by the laser irradiation for forming the opening of the resin film, and thereby the semiconductor characteristic of the device is improved. For example, the modification of the semiconductor structure portion makes it possible to improve the crystallinity of the semiconductor layer of the semiconductor structure portion. As such, the manufacturing method of the present invention can improve not only a process efficiency but also a TFT performance by performing the laser irradiation.

The term "flexible" of the "flexible semiconductor device" used in the present description substantially means that the semiconductor device has such a flexibility characteristic that the device can be inflected. The "flexible semiconductor device" of the present invention may be referred to as "flexible semiconductor element", in view of the structure thereof.

Moreover, the term "opening" used in the present description means a through-hole intentionally prepared in the resin film by the laser irradiation for the purpose of providing an electroconductive member. Thus, the term "opening" used in the present description does not include holes prepared for the other purposes. This means that the term "opening" associated with the present invention excludes "hole" formed by machining or etching process and the like.

The "semiconductor structure portion" used in the present description substantially means a stacked layer structure with a semiconductor layer and an insulating layer formed thereon.

Furthermore, the term "annealing" or "anneal treatment" used in the present description substantially means a heat treatment intended to improve or stabilize the properties such as "crystalline state", "degree of crystallization" and/or "mobility".

In one preferred embodiment, the semiconductor structure portion is formed in the step (i) so as to comprise "semiconductor layer" and "insulating layer formed on the surface of the semiconductor layer". Thereby, an electroconductive member can serve as a gate electrode by using at least one part of the insulating layer of the semiconductor structure portion as a gate insulating film. In this embodiment, the insulating layer of the semiconductor structure portion may be subjected to a heat treatment by the laser irradiation of the step (iii).

In one preferred embodiment, a layer which comprises silicon (i.e., a silicon-containing layer) is formed as the semiconductor layer of the semiconductor structure portion, and a silicon oxide film is formed as the insulating layer provided on the surface of the semiconductor layer.

In the production method of the present invention, a layer which comprises an oxide semiconductor material (i.e., oxide semiconductor-containing layer) may be formed as the semiconductor layer of the semiconductor structure portion. In this case, it is preferred that the laser irradiation of the step (iii) is performed under an oxygen atmosphere since an oxygen defect of the oxide semiconductor is restored and thus the TFT performance can be improved.

In one preferred embodiment, a pulse laser is used for performing the laser irradiation of the step (iii). The laser irradiation using the pulse laser makes it possible to retain the annealing heat influence in the vicinity of the surface of the semiconductor layer where the laser is directly irradiated.

In one preferred embodiment, an insulating film is formed on the metal foil, and the semiconductor structure portion is formed on the insulating film. It is preferable to form this insulating film by a surface oxidation of the metal foil.

In one preferred embodiment, a source electrode and a drain electrode are formed from the metal foil by subjecting the metal foil to an etching treatment. In this embodiment, the metal foil, which has been used as a supporting member in the manufacturing process of the flexible semiconductor device, can be also used as a constituent material of the electrodes (i.e., a constituent element of the flexible semiconductor device).

In one preferred embodiment, the opening through which the surface of the semiconductor structure portion is exposed and the opening in which an interlayer connecting portion is provided are formed at substantially the same process in the step (iii).

In another preferred embodiment, the insulating layer is formed in the surface area (surface portion) of the semiconductor layer by the laser irradiation of the step (iii). That is, the laser irradiation not only serves to form the opening of the resin film, but also serves to form the insulating layer (for example, an oxide film) due to the heating of the surface of the semiconductor layer upon forming the opening of the resin film. It is especially preferred in this embodiment that the laser irradiation is performed under an oxygen atmosphere.

The present invention further provides a flexible semiconductor device which is obtained by the above manufacturing method. Such flexible semiconductor device comprises:

a support layer;

a semiconductor structure portion formed on the support layer; and a resin film formed on the semiconductor structure portion, wherein the resin film is provided with an opening formed therein, and wherein an electroconductive member (electrically-conductive member) is disposed in the opening of the resin film, the electroconductive member being in contact with the surface of the semiconductor structure portion. Preferably, the opening of the resin film is one formed by a laser irradiation.

For one thing, the flexible semiconductor device of the present invention is characterized in that the opening formed in the resin film due to the laser irradiation is provided in a TFT stacking structure. The opening of the resin film is provided such that the surface of the semiconductor structure portion is exposed therethrough, and the electroconductive member is arranged within the opening to be in contact with the exposed surface of the semiconductor structure portion. As such, the flexible semiconductor device of the present invention comprises the laser-induced opening, and thus the opening of the resin film has a tapered form in the direction of thickness of the device. In other words, a wall surface of the opening and the top surface of the resin film form an obtuse angle with each other.

In this regard, the flexible semiconductor device of the present invention comprises the surface of the semiconductor structure portion, the surface having been heat-treated by the laser irradiation for forming the film opening. That is, the flexible semiconductor device of the present invention comprises the semiconductor structure portion that has been subjected to an annealing treatment by the laser irradiation. It is conceivable from another point of view that the various relationships among the layers of the flexible semiconductor device of the present invention are designed so that the surface of the semiconductor structure portion is easily heat-treated by the laser irradiation via the opening of the resin film. Accordingly, the present invention also has a feature of a unique stacking structure wherein there is provided a support layer, a semiconductor structure portion formed on the support layer, a resin film formed on the semiconductor structure portion and an electroconductive member formed within the opening of the resin film.

With respect to the term "support" of "support layer", it is used in the present description from a point of view that it can serve to support the layers of the TFT during the manufacturing procedure of the semiconductor device as well as in the obtained semiconductor device.

In one preferred embodiment, the semiconductor structure portion comprises "semiconductor layer comprising semiconductor material therein" and "insulating layer formed on the surface of the semiconductor layer". It is preferred in this case that at least a part of the insulating layer functions as a gate insulating film, and also at least a part of the electroconductive member functions as a gate electrode.

In one preferred embodiment, the semiconductor layer comprises silicon, and the insulating layer consists of a silicon oxide film. It is preferred in this case that the semiconductor structure portion is one having been subjected to the heat-treatment by the laser irradiation, and thus the semiconductor layer has a carrier mobility of about 3 $cm^2/Vs$ to about 300 $cm^2/Vs$. In addition, the semiconductor layer may comprise an oxide semiconductor material, in which case the oxide semiconductor is preferably ZnO or InGaZnO.

In one preferred embodiment, the support layer consists of a metal foil. In this case, it is preferred that the insulating film is formed on the metal foil, and that the semiconductor structure portion is formed on the insulating film. Moreover, it is preferred that the metal foil comprises a portion serving as a source electrode and a portion serving as a drain electrode, both of which are electrically connected with the semiconductor structure portion.

In the flexible semiconductor device of the present invention, the resin film is suitable one for the formation of the opening by the laser irradiation. For example, the resin film comprises at least one kind of resin selected from the group consisting of an epoxy resin, a polyimide resin, an acrylic resin, a polyethylene terephthalate resin, a polyethylenenaphthalate resin, a polyphenylene sulfide resin, a polyphenylene ether resin, and a polytetrafluoroethylene.

In one preferred embodiment, the opening for the provision of the electroconductive member (i.e., the opening through which the surface of the semiconductor structure portion is exposed at the point in time when the manufacturing process of the device is carried out) and the opening for the provision of the interlayer connecting portion are formed in the same resin layer.

Effect of the Invention

In accordance with the production method of the present invention, the resin film covering the semiconductor structure portion is irradiated with a laser, and thereby making it possible to not only form an opening in the resin film wherein the surface of the semiconductor structure portion is exposed through the opening, but also subject the exposed surface of the semiconductor structure portion to the heat treatment induced by the laser irradiation. Therefore, the formation of the opening and the modification of the film quality or property of the semiconductor structure portion are achieved in the same process. That is, the present invention makes it possible to provide the flexible semiconductor device with high performance as well as a satisfactory productivity thereof. In other words, the present invention not only can improve an efficiency of the manufacturing process due to the laser irradiation of the resin film, but also can improve the TFT performance due to the heat-treatment attributable to such laser irradiation.

DETAILED DESCRIPTION OF THE INVENTION

Figure 1:
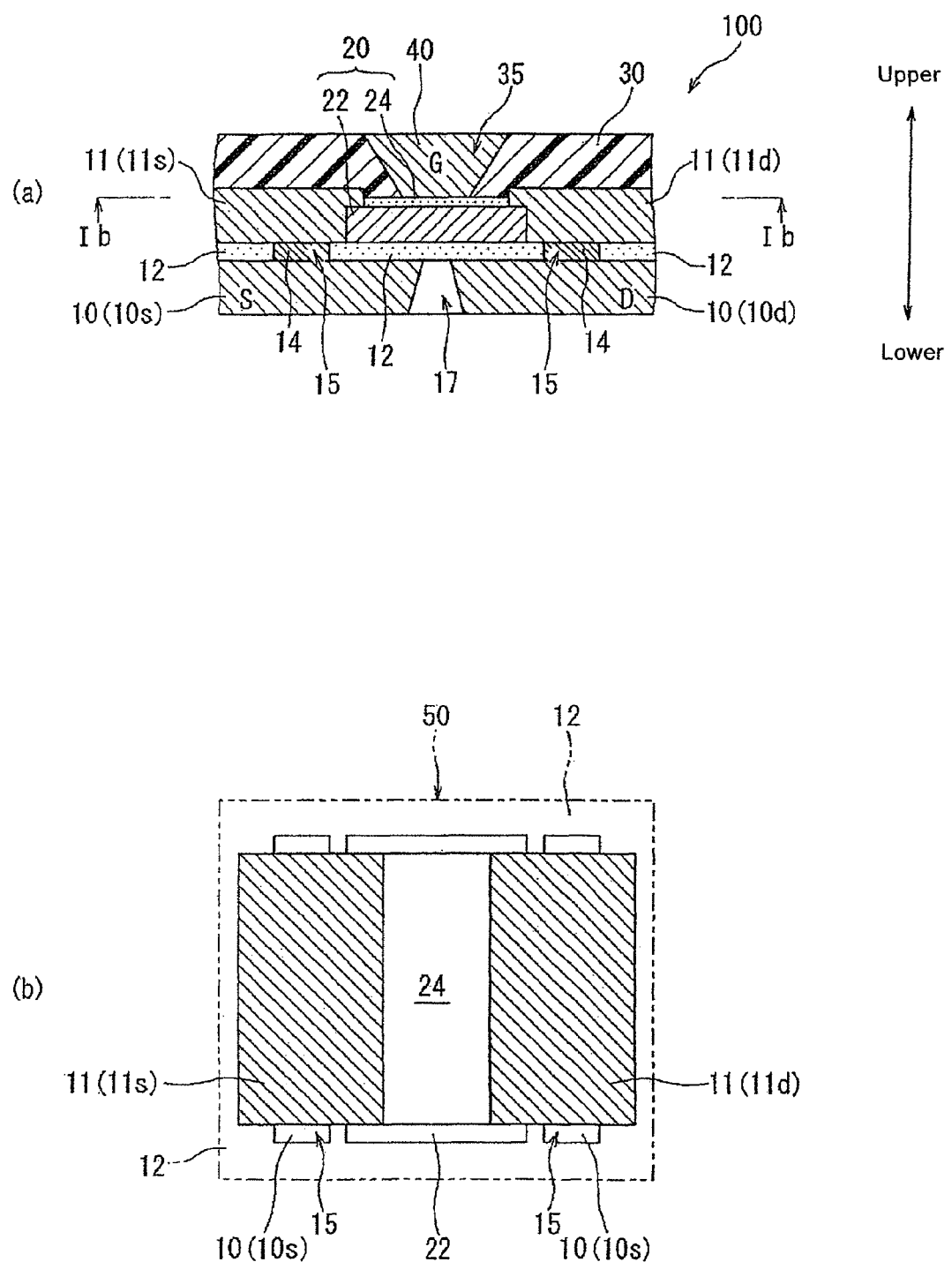
FIG. 1(a) schematically illustrates a cross sectional view of the flexible semiconductor device according to an embodiment of the present invention, showing the structure of the device.
FIG. 1(b) illustrates a cross sectional view of the flexible semiconductor device taken along line 1b-1b of FIG. 1(a).
Figure 2:
FIGS. 2(a) to 2(c) illustrate cross-sectional views illustrating the steps in a manufacturing process of a flexible semiconductor device according to an embodiment of the present invention.
Figure 2:
Figure 2:
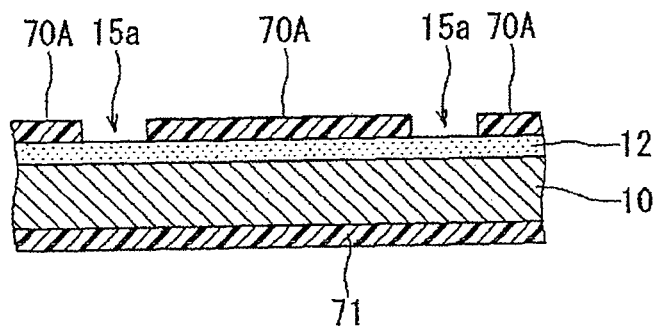
Figure 2:
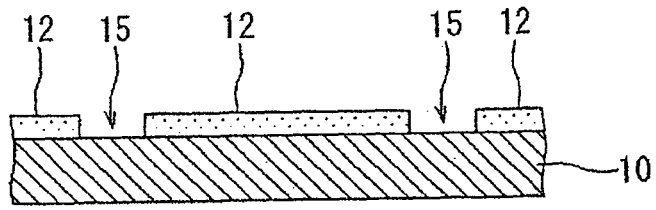

Hereinafter, some embodiments of the present invention are illustrated with reference to Figures. In the following Figures, the same reference numeral indicates the element which has substantially the same function for simplified explanation. The dimensional relationship (length, width, thickness and so forth) in each Figure does not reflect a practical relationship thereof.

Each "direction" referred to in the present description means the direction based on the spacial relationship between the metal foil/support layer 10 and the semiconductor layer 22, in which each of upward direction and downward direction is mentioned relating to the direction in the drawings for convenience. Specifically, each of upward direction and downward direction corresponds to the upward direction and downward direction in each drawing. The side on which the semiconductor layer 22 is formed based on the metal foil/support layer 10 is referred to as "upward direction" and the side on which the semiconductor layer 22 is not formed based on the metal foil/support layer 10 is referred to as "downward direction".

With reference to FIGS. 1(a) and (b), the flexible semiconductor device 100 according to one embodiment of the present invention will be explained. FIG. 1(a) is a schematic sectional structure of the flexible semiconductor device 100 whereas FIG. 1(b) is a schematic sectional plan view of the device taken along line 1b-1b of FIG. 1(a).

The semiconductor device of the present invention is a flexible semiconductor device 100 which has flexibility characteristic. As illustrated in FIGS. 1(a) and 1(b), the flexible semiconductor device 100 comprises a support layer 10, a semiconductor structure portion 20 formed on the support layer 10, and a resin film 30 being formed so as to cover the semiconductor structure portion 20.

Seen from the cross section of the device, an opening 35 is formed in the resin film 30 wherein the opening 35 penetrates between the upper surface of the semiconductor structure portion 20 and the upper surface of the semiconductor device 100. This opening 35 is one formed by the laser irradiation. In the flexible semiconductor device 100, an electroconductive member 40 is formed within the opening 35, which member being in contact with the surface of the semiconductor structure portion 20. The opening 35 formed by the laser irradiation has a form enabling the surface of the semiconductor structure portion 20 to be exposed at the point in time of the manufacturing of the device (which will be described later).

The resin film 30 is made of a resin material which has flexibility. This resin film 30 can serve as a supporting substrate for supporting the semiconductor structure portion 20 (or TFT structure therewith) and is preferably made of a thermoplastic resin material or a thermosetting resin material having flexibility characteristic after being cured. Moreover, it is particularly preferred in the present invention that the resin film 30 is adapted for the formation of the opening by the laser irradiation. Examples of the resin films 30 preferably include at least one kind of resin selected from the group consisting of an epoxy resin, a polyimide resin, an acrylic resin, a polyethylene terephthalate resin, a polyethylenenaphthalate resin, a polyphenylene sulfide resin, a polyphenylene ether resin, and a polytetrafluoroethylene. Just as an example, the resin film 30 may be a polyimide film. These resin materials are excellent in the dimensional stability and thus is preferably used as a flexible material of the flexible semiconductor device 100. If a technique such as photolithography is applied to the formation of the opening of the resin film, it would be required to use a resin which is particularly suitable for such photolithography (for example, a resin film is required to be made of a photopolymer). That is, the use of the photolithography technique results in relatively severe restriction to the material selection. In this regard, the present invention can reduce such severe restriction to the material selection involved in the photolithography since the opening is one formed by the laser irradiation.

As for the electroconductive member 40 formed within the opening 35, it is preferably made from an electroconductive paste material. As the electroconductive paste material, the paste material obtained by dispersing a single metal such as Au, Ag, Cu, Pt, Pd, Al or Pb or the mixture or alloy thereof, an electroconductive filler such as a carbon filler, a carbon nanotubes and the like into a solvent-containing binder which comprises an organic resin (e.g., epoxy resin) and/or a solvent (e.g., butylcarbitol acetate (BCA)). The filling of the opening 35 with such electroconductive paste material can produce the electroconductive member 40.

The semiconductor structure portion 20 of the flexible semiconductor device 100 preferably comprises "semiconductor layer 22 comprising a semiconductor material" and "insulating layer 24 formed on the surface of the semiconductor layer 22".

As a semiconductor material which constitutes the semiconductor layer 22, any suitable materials may be used. For example, the semiconductor layer may be made of the semiconductor material such as silicon (e.g., Si) and germanium (Ge), or an oxide semiconductor material. The oxide semiconductor may be made of an elementary oxide such as ZnO, $SnO_2$, $In_2O_3$ and $TiO_2$, or a composite oxide such as InGaZnO, InSnO, InZnO and ZnMgO. As needed, a compound semiconductor may also be used, in which case a compound thereof is for example GaN, SiC, ZnSe, CdS, GaAs and so forth. Furthermore, an organic semiconductor may also be used, in which case an organic thereof is for example pentacene, poly-3-hexyl-thiophene, porphyrin derivatives, copper phthalocyanine, C60 and so forth.

According to the flexible semiconductor device 100 of the present invention, at least a part of the insulating layer 24 formed so as to contact with the surface of the semiconductor layer 22 can function as the gate insulating film, while on the other hand at least a part of the electroconductive member 40 can function as the gate electrode. For example, the semiconductor layer 22 may comprise silicon, and the insulating layer 24 may comprise silicon oxide.

The flexible semiconductor device 100 of the present invention comprises the semiconductor structure portion 20 which has been subjected to an annealing treatment due to the laser irradiation. Specifically, as a result of the heat treatment induced by the laser irradiation for forming the opening 35, the film quality of the semiconductor structure portion 20 has been modified as compared with that before the laser irradiation. As an example, a component of the semiconductor structure portion 20 is modified from an amorphous silicon (before the irradiation) to a polycrystalline silicon (after the irradiation). Such polycrystalline silicon has its average particle diameter of a few hundred nm to about 2 micrometers, for example. In a case where the semiconductor layer 22 consists of polycrystalline silicon at the point in time before the laser irradiation, the degree of the crystallization thereof can be improved by the irradiation. Moreover, the modification of the film quality of the semiconductor structure portion 20 can provide an improved mobility of the semiconductor layer 22. This means that there may be a significant difference in the mobility of the layer 22 between the before-irradiation and the after-irradiation.

As will be appreciated from the foregoing, the term "film quality" used in the present description means the characteristic or physical properties of an intended layer or film. Especially as for the film quality of the semiconductor layer, it substantially means the properties such as "crystalline condition", "degree of crystallization" and/or "mobility" of the semiconductor layer. In other words, the modification of the film quality substantially means the change or improvement of "crystalline condition", "degree of crystallization" and/or "mobility".

In this regard, the brief explanation regarding the relationship between the crystal particle diameter of the silicon semiconductor and the carrier mobility is as follows, for example:

The mobility of a-Si (amorphous silicon) is less than 1.0 cm$^2$/Vs. The mobility of μC-Si (microcrystalline silicon) is about 3 (cm$^2$/Vs), and the crystal particle diameter thereof is in the range of about 10 nm to about 20 nm. The mobility of pC-Si (polycrystalline silicon) is about 100 (cm$^2$/Vs) or in the range of about 10 to about 300 (cm$^2$/Vs), and the crystal particle diameter thereof is in the range of about 50 nm to about 0.2 μm. Therefore, when the film quality is modified due to the annealing treatment induced by the laser irradiation from a-Si (amorphous silicon) to μC-Si (microcrystal silicon) or pC-Si (polycrystalline silicon), the mobility can increase by more than several times (i.e., several times, tens times, hundreds times and so on). For example, the carrier mobility at the point in time after the modification of the film quality can be in the range of about 3 to about 300 cm$^2$/Vs. As an additional remark, the mobility of sC-Si (single crystal silicon) is about 600 (cm$^2$/Vs) or more.

In the meanwhile, the numerical value of the "mobility" used in the present description is one represented by the field-effect mobility of TFT. An example of the calculation method and measuring method of the mobility is as follows:

In order to obtain the numerical value of "mobility", a saturation voltage is applied between the source electrode and the drain electrode, at which time the value of the drain current is measured while changing the gate voltage. Provided that the channel length is denoted by "L", the channel width is denoted by "W", the capacitor capacity per unit area of the channel part is denoted by "C", the field-effect mobility is denoted by "μ", the gate voltage is denoted by "Vg" and the threshold is denoted by "Vt", the drain current I is expressed by the following equation (1):

$$I = \mu \times C \times (W/2L) \times (Vg-Vt)^2 \quad (1)$$

Therefore, based on the equation (1), the mobility "μ" used in the present invention can be derived from the following equation (2):

$$\mu = I / \{C \times (W/2L) \times (Vg-Vt)^2\} \quad (2)$$

The semiconductor structure portion 20 is supported by the support layer 10. For example, the support layer 10 may consist of a metal foil. It is preferred that the metal of the metal foil 10 is one with an electric conductivity and relatively high melting point. For example, copper (Cu, melting point: 1083° C.), nickel (Ni, melting point: 1453° C.), aluminum (Al, melting point: 660° C.) and stainless steel (SUS) may be used. It is also preferred that an insulating film 12 is formed on the metal foil 10. More particularly, for example, it is preferred that the insulating film 12 made of an inorganic insulating material (e.g., silicon oxide or silicon nitride) is formed on a part of the surface (top face) of the metal foil 10, and that the semiconductor structure portion 20 (specifically "semiconductor layer 22") is provided on the insulating film 12. In the meanwhile, the forming region for the insulating film 12 is schematically illustrated by reference numeral "50" in FIG. 1(b).

The insulating film 12 may be formed by oxidizing the surface of the metal foil 10. It is preferred in this case that a metal foil made of a valve metal (for example, an aluminum foil) is used as the metal foil 10. An anodic oxide film can be formed on the surface of the metal foil by anodizing the valve metal thereof by using a chemical conversion solution, and thus this anodic oxide film may be used as the insulating film 12. This "anodic oxide film" is a very thin and densified oxide layer, providing an advantageous effect that the insulating film 12 has no defect or the reduced degree of the defect.

The material for the insulating film 12 is not limited to the above, but any suitable materials may be used depending on the property required for the insulating film 12. For example, the material for the insulating film 12 may be the same as that of the gate insulating film 24 (for example, silicon oxide or silicon nitride). Furthermore, not only the inorganic insulating material but also the other insulating materials such as organic insulating materials may be used as the material of the insulating film 12.

In the illustrated embodiment of Figures, the source electrode 10s and the drain electrode 10d are formed from the metal foil 10 serving as the support layer. Specifically, for example, the opening 17 is formed in the metal foil 10 by patterning the metal foil 10, and thereby the parts serving the source electrode 10s and the drain electrode 10d are provided in the metal foil 10.

There are formed via openings 15 in some parts of the insulating layers 12, which parts are located on the metal foil 10. Within the via openings 15, interlayer connecting portions (vias) 14 made of conductive material are provided. For example, the filling of the via openings 15 of the insulating film 12 with a conductive material (for example, Ag paste) can produce the interlayer connecting portion (via) 14.

In the illustrated embodiment of Figures, the source electrode 10s is connected to the extraction electrode 11(11s) formed on the insulating layer 12 through the interlayer connecting portion 14. Similarly, the drain electrode 10d is connected to the extraction electrode 11(11d) formed on the insulating layer 12 through the interlayer connecting portion 14. In addition, there may be an embodiment where a part of the extraction electrode (11s, 11d) extends to within the via opening 15, thereby the interlayer connecting portion 14 is formed from the extended part of the extraction electrode.

The extraction electrodes 11 (11s, 11d) are in contact with the semiconductor layer 22, while being in contact with the source electrode and the drain electrode. Specifically, the extraction electrode 11s which is electrically connected to the source electrode 10s is in contact with an end portion of the semiconductor layer 22. Similarly, the extraction electrode 11d which is electrically connected to the drain electrode 10d is in contact with the other end portion of the semiconductor layer 22. In this regard, the region which is located between the extraction electrode 11s and the extraction electrode 11d functions as a channel region. The gate insulating film 24 is located on the channel region, and the gate electrode 40 (i.e., the electroconductive member 40) is continuously located on the film 24. Examples of the material to be used as the extraction electrode 11 (11s, 11d) include a metallic material such as gold (Au), silver (Ag), copper (Cu), nickel (nickel), chromium (Cr), cobalt (Co), magnesium (Mg), calcium (Ca), platinum (Pt), molybdenum (Mo), iron (Fe), zinc (Zn), titanium (Ti), tungsten (W); a electrically-conductive oxide such as tin oxide ($SnO_2$), indium tin oxide (ITO), fluorine-containing tin oxide (FTC)), ruthenium oxide ($RuO_2$), iridium oxide ($IrO_2$), platinum oxide ($PtO_2$) and the like. For example, Ag paste may be used to form the extraction electrode 11 (11s, 11d). The extraction electrode 11 can be formed by the printing technique (e.g., ink jet printing process) using such paste material.

Next, with reference to FIGS. 2(a) to 2(c), FIGS. 3(a) to 3(c) and FIGS. 4(a) to 4(c), the production method of the flexible semiconductor device 100 according to the present invention will be explained. FIGS. 2(a) to 2(c), FIGS. 3(a) to 3(c) and FIGS. 4(a) to 4(c) respectively show cross-sectional views illustrating the steps in a manufacturing process of the flexible semiconductor device 100.

Upon carrying out the manufacturing method of the present invention, the step (i) is firstly performed. That is, a semiconductor structure portion comprising a semiconductor layer is formed on a metal foil.

Specifically, a metal foil 10 which can serve as a support layer is first provided as shown in FIG. 2(a). For example, a copper foil is provided. As the metal foil 10, any of commercially available ones can be used. The metal foil 10 preferably has a thickness in the range of about 3 μm to about 100 μm, more preferably in the range of about 4 μm to about 20 μm, still more preferably in the range of about 8 μm to about 16 μm.

Next, an insulating film 12 is formed on the surface of the metal foil 10, and thereafter a resist coating 70A is formed thereon. As shown in FIG. 2(b), the resist coating 70A has openings in the predetermined areas at which the vias 14 will be formed. The insulating film 12 provided on the surface of the metal foil 10 may be formed by the "anodic oxidation of valve metal" as mentioned above (especially in a case where the metal foil is made of a valve metal). However, it is possible to form the insulating film 12 by performance of the other methods. For example, the insulating film 12 can be formed by a sol gel process. With respect to the sol gel process, the insulating film 12 can be formed by applying (for example, spin-coating) an organic-inorganic hybrid material wherein organic molecules are bonded to the siloxane backbone, followed by calcinating it at the temperature of about 300° C. to about 600° C. The thickness of the insulating film 12 is, for example, approximately in the range of 0.1 μm to about 1 μm.

As shown in FIG. 2(b), the resist coating 71 may be provided on the whole bottom surface of the metal foil 10 in addition to the resist coating provided on some parts of the top surface thereof. Although the formation of the resist coatings 70A and 71 is performed according to a typical photolithography process, it may be performed according to a printing process.

Subsequent to the provision of the resin coating 70A, the via openings 15 are formed by partially etching away the insulating film 12 with the resist coating 70A serving as a mask, as shown in FIG. 2(c). The etching of the insulating film 12 can be performed for example by a dry etching using $CF_3$. After the etching process is completed, the resist coatings 70A and 71 are removed.

Subsequently, the semiconductor layer 22 is formed on the metal foil 10 as shown in FIG. 3(a). Specifically, the semiconductor layer 22 is formed on the insulating film 12 provided on the metal foil 10. For example, the thickness of the semiconductor layer may be approximately in the range of about 5 nm to about 990 nm. The formation of the semiconductor layer 22 can be performed for example by a thin film formation process such as a vacuum deposition process, a sputtering process and a plasma CVD process, as well as by a printing process such as a relief printing process, a gravure printing process, a screen printing process and an ink jet printing process. For example in a case where the semiconductor layer 22 is a silicon layer, an amorphous silicon-containing semiconductor layer 22 can be formed by applying a cyclic silane compound-containing solution (for example, cyclopentasilane-containing toluene solution) to the predetermined position on the insulating film 12 with the ink jet printing process, followed by subjecting it to a heat treatment at about 300° C.

Then, the insulating layer 24 is formed on the semiconductor layer 22, as shown in FIG. 3(b). For example, the thickness of the insulating layer 24 may be approximately in the range of about 5 nm to about 990 nm. The insulating layer 24 can function as a gate insulating film in the flexible semiconductor device 100. The insulating layer 24 (gate insulating film) can be provided by forming a thin film of the silicon oxide for example by performing a thermal oxidation process, or by using of TEOS. Moreover, the insulating layer 24 can also be formed by the sol gel process as with the insulating film 12. In such case, the ink jet printing process may be adopted to apply the raw material of the insulating layer 24.

The formation of the insulating layer 24 on the semiconductor layer 22 provides a semiconductor structure portion. The thickness of the semiconductor structure portion 20 is for example in the range of about 10 nm to about 1 μm.

Figure 3:
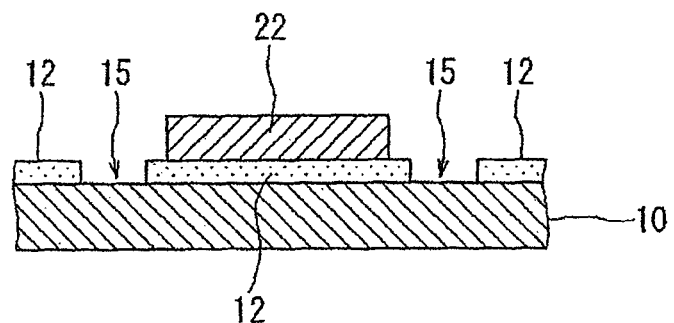
FIGS. 3(a) to 3(c) illustrate cross-sectional views illustrating the steps in a manufacturing process of a flexible semiconductor device according to an embodiment of the present invention.
Figure 3:
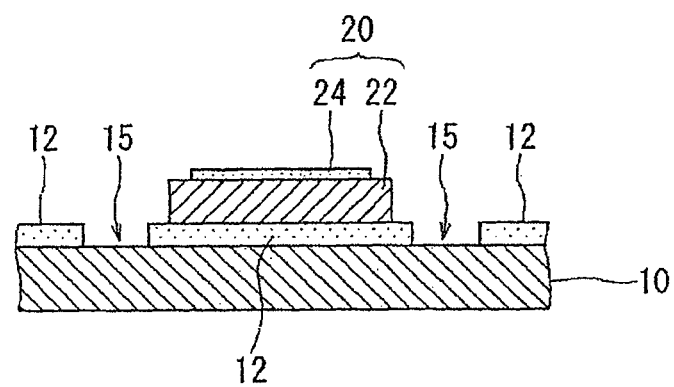
Figure 3:
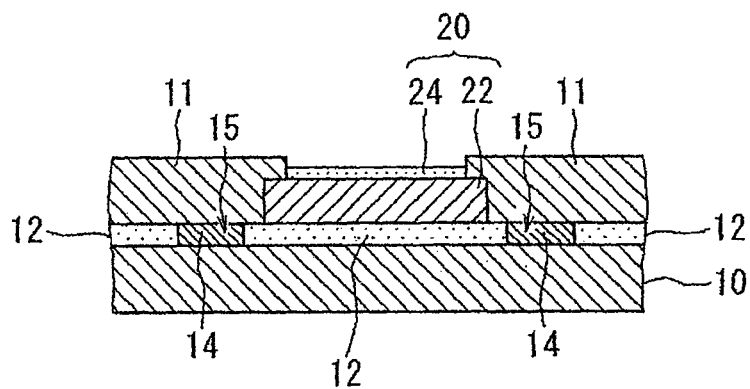

Next, as shown in FIG. 3(*c*), the extraction electrodes are formed on the metal foil 10. The extraction electrodes 11 are located at the positions above the openings 15 (or the interlayer connecting portions 14). Specifically, the extraction electrode 11 is formed so that one end of the extraction electrode 11 comes into contact with a via 14 whereas the other end of the extraction electrode 11 comes into contact with the semiconductor layer 22 of the semiconductor structure portion 20. For example, the thickness of the extraction electrode may be in the range of about 50 nm to about 5 μm). The formation of the extraction electrode 11 can be performed by applying Ag paste through any suitable printing process such as a screen printing process, a gravure printing process and an ink jet process. A part of the extraction electrode 11 may extend to the region within the opening 15, and thereby the via 14 is formed. Alternatively, the interlayer connecting portion 14 may be firstly formed within the opening 15, and thereafter the extraction electrode 11 may be formed so that the extraction electrode 11 comes into contact with the interlayer connecting portion 14.

Figure 4:
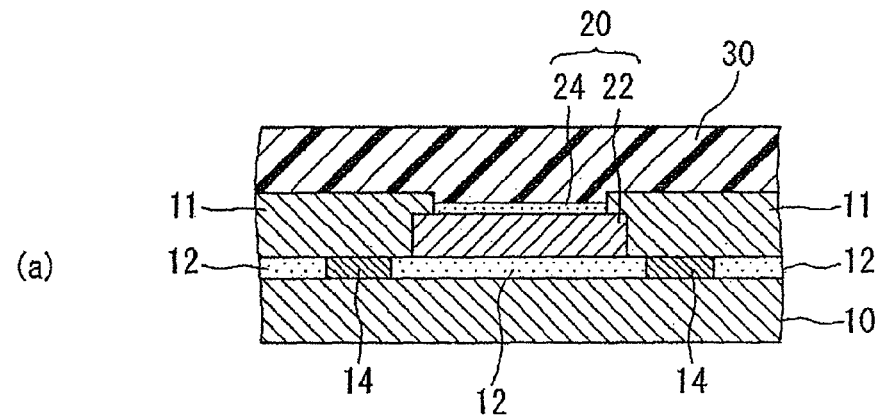
FIGS. 4(a) to 4(c) illustrate cross-sectional views illustrating the steps in a manufacturing process of a flexible semiconductor device according to an embodiment of the present invention.
Figure 4:
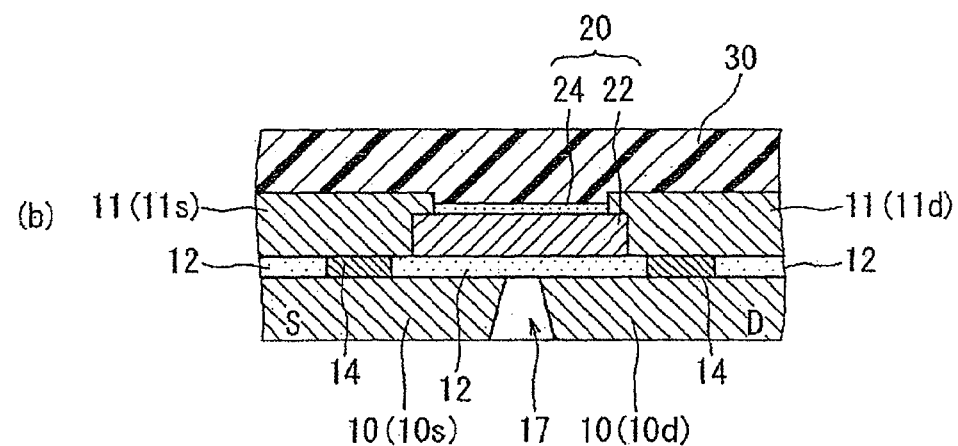
Figure 4:
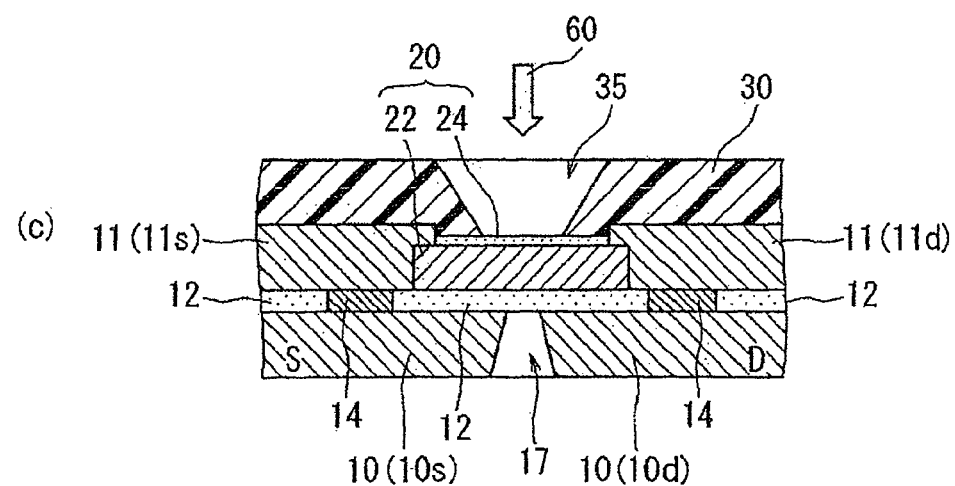

Next, as shown in FIG. 4(*a*), the resin film 30 is formed on the metal foil 10 so as to cover the semiconductor structure portion 20 and the extraction electrode 11. That is, the step (ii) of the production method of the present invention is carried out. The formation procedure of the resin film 30 is not particularly limited. For example, there is a procedure for forming the resin film wherein the resin film 30 is laminated in a semi-cured condition onto the metal foil 10, followed by a complete curing thereof. This procedure may be performed through applying an adhesive material to the laminating surface of the resin film. There is another procedure for forming the resin film wherein the semi-cured resin is applied onto the support layer 10 by performance of a spin-coating process, followed by performance of a complete curing thereof. The thickness of the resin film 30 is for example in the range of about 4 μm to about 100 μm. The formation of the resin film 30 makes it possible to protect the semiconductor structure portion 20 and also to safely perform a handling or conveying procedure in the subsequent step (e.g., the patterning treatment of the metal foil 10 and the like).

Then, as shown in FIG. 4(*b*), the metal foil 10 serving as the support layer is subjected to a patterning treatment, thereby forming the source electrodes 10*s* and the drain electrodes 10*d* from the metal foil 10. In the illustrated embodiment of FIG. 4(*b*), a part of the support layer 10 is etched away to form the opening 17, so that the source electrodes 10*s* and the drain electrodes 10*d* are separated from each other.

Next, the step (iii) of the production method of the present invention is carried out. As shown in FIG. 4(*c*), the resin film 30 is irradiated with a laser (60) to form an opening 35 through which the surface of the semiconductor structure portion 20 is exposed. Specifically, the resin film 30 is subjected to a hole forming process by the laser irradiation (60), thereby the surface (especially the top face) of the insulating layer of the semiconductor structure portion 20 is exposed. In this regard, according to the present invention, the semiconductor structure portion 20 can be heated by the laser irradiation (60), and thus the semiconductor structure portion 20 is subjected to a heat-treatment (e.g., an annealing treatment).

Due to such "heat-treatment" or "annealing treatment" induced by the laser irradiation, the film quality of the semiconductor structure portion 20 is modified. In particular, one or more intended parts of the semiconductor structure portion (especially the semiconductor layer) can be locally subjected to the heat-treatment or annealing treatment, and thereby making it possible to achieve a desired modification of the film quality. For example, the degree of the crystallization of the semiconductor layer 22 in the semiconductor structure portion 20 can be improved by the heat-treatment or annealing treatment. Alternatively, due to the heat-treatment or annealing treatment, the crystallinity of the semiconductor layer 22 can change from an amorphous state to a polysilicon state. Alternatively, the mobility of the semiconductor layer 22 can increase and improve for example from about 1.0 $cm^2/Vs$ or less to the range of about 3 to about 300 $cm^2/Vs$. Furthermore, according to the present invention, the film quality of the insulating layer 24 can also be improved by the heat-treatment or annealing treatment induced by the laser irradiation, which leads to an achievement of the improved properties of the gate insulating film.

Figure 5:
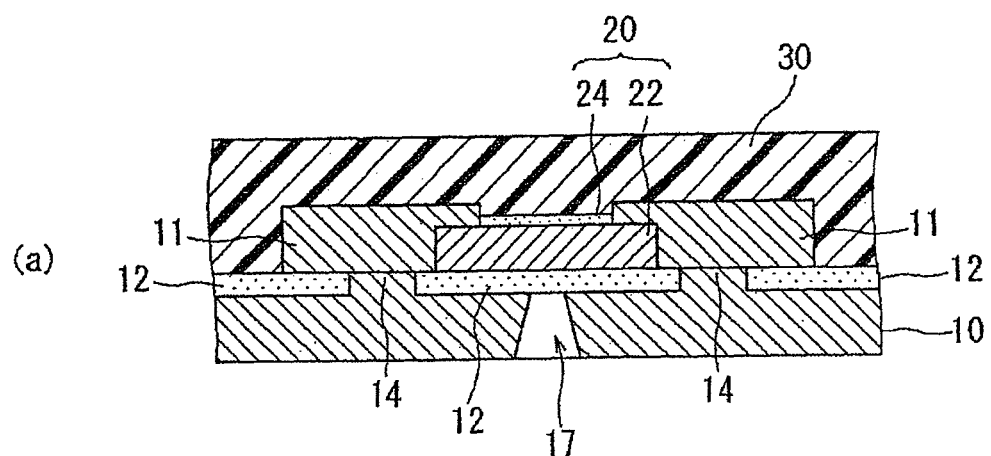
FIGS. 5(a) and 5(b) illustrate cross-sectional views illustrating the steps in a manufacturing process of a flexible semiconductor device according to an embodiment of the present invention.
Figure 5:
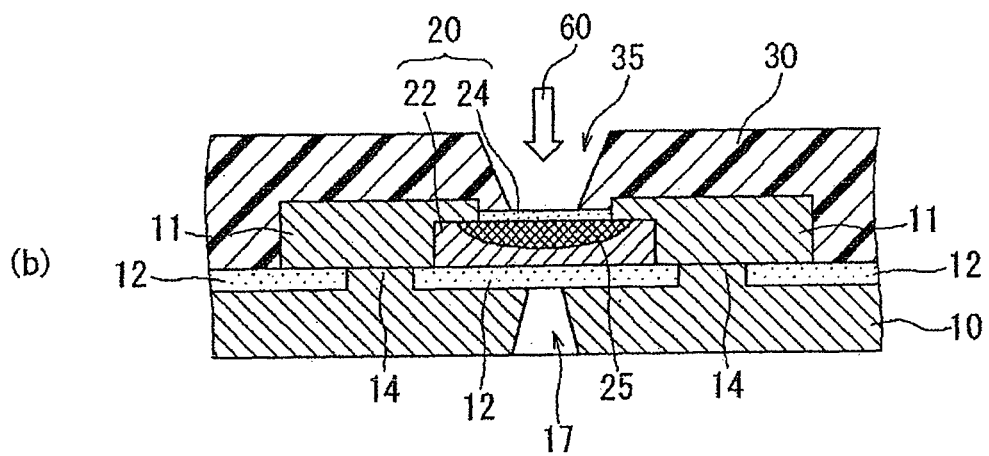

FIGS. 5(*a*) and 5(*b*) are schematic illustration for explaining the film quality modification of the semiconductor structure portion 20 by the laser irradiation (60). FIG. 5(*a*) illustrates the construction at the point in time before the laser irradiation is performed, wherein the insulating layer (gate insulating film) 24 is stacked on the semiconductor layer 22.

The laser irradiation (60) according to the present invention makes it possible to simultaneously perform the formation of the laser opening 35 and heat treatment of the semiconductor layer 22 through the insulating layer 24. This means that there is formed a heat-treated area (25) in the semiconductor layer 22 upon the formation of the opening 35. That is, an improvement in the TFT performance such as the improvement in the degree of the crystallization of the semiconductor layer 22 (for example, improvement from the amorphous state to the polycrystalline state), the improvement of the crystallinity in the semiconductor layer 22 can be provided by the laser irradiation (60) for forming an opening in the resin film.

After the laser irradiation, the step (iv) is carried out. In other words, an electroconductive member, i.e. the gate electrode 40 is formed by filling the laser opening 35 with an electroconductive material.

Through the above steps, there can be finally obtained the flexible semiconductor device 100 having a construction as shown in FIG. 1(*a*).

According to the production method of the present invention, the opening 35 through which the surface of the semiconductor structure portion 20 (i.e., insulating layer 24) can be exposed is formed by irradiating the resin film which serves to cover the semiconductor structure portion 20 with a laser (60). Thereafter, the gate electrode 40 is formed by filling up the opening 35 with an electroconductive material. Therefore, the formation of the opening 35 for the gate electrode 40 and the modification of the film quality of the semiconductor structure portion 20 can be performed substantially in the same process. That is, the laser irradiation of the resin film according to the present invention can not only improve the efficiency of the manufacturing process, but also improve the TFT performance.

Hereinafter, the "laser irradiation" which is one of the features of the present invention will be explained in detail.

Figure 6:
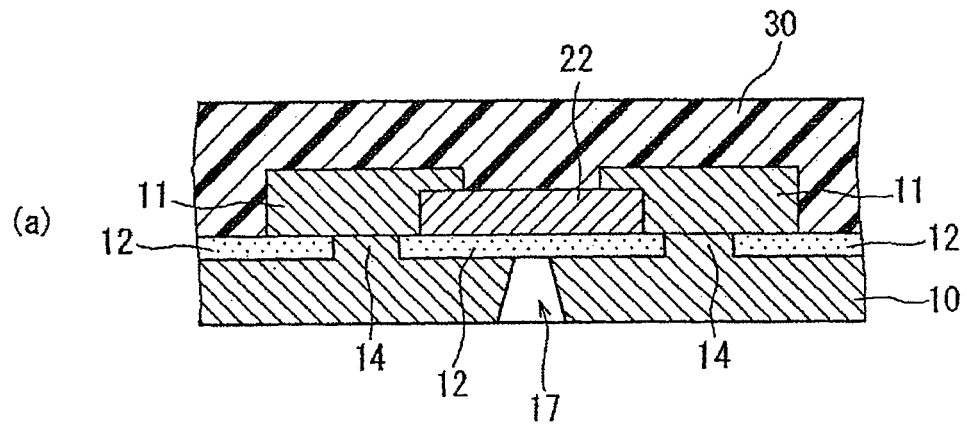
FIGS. 6(a) and 6(b) illustrate cross-sectional views illustrating the steps in a manufacturing process of a flexible semiconductor device according to an embodiment of the present invention.
Figure 6:
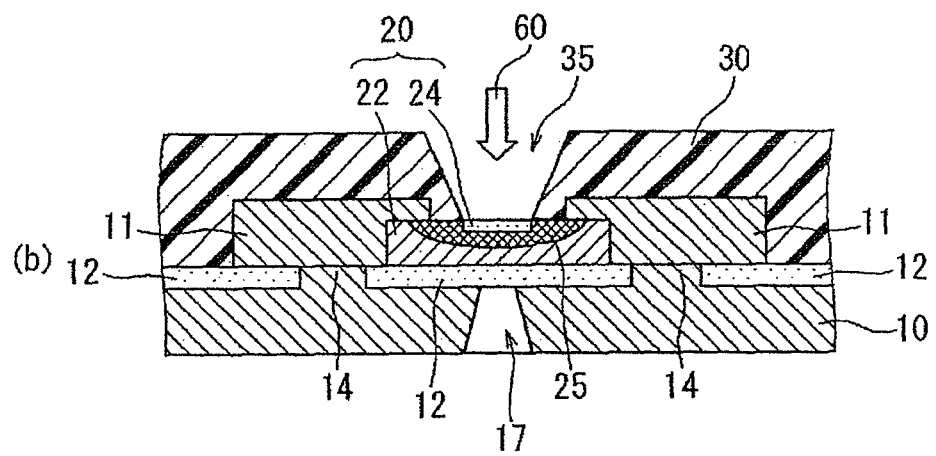

Similarly to FIG. 5(*a*), FIG. 6(*a*) illustrates the construction at the point in time before the laser irradiation is performed. In the illustrated embodiment of FIG. 6(*a*), the insulating layer 24 is not provided on the semiconductor layer 22 of the semiconductor structure portion 20 (in some cases a natural-oxidized film might exist on the layer 22). In such embodiment, the irradiating the laser (60) under an oxygen atmosphere (for example, under atmosphere containing oxygen and/or ozone or under an air atmosphere) can not only cause the formation of the laser opening 35, but also cause the formation of an insulating film (oxide film) 24 at the bottom of the resulting laser opening 35, as shown in FIG. 6(b). In addition, the semiconductor layer 22 is heated and thus a heat-treated region (25) is provided in the semiconductor layer 22. This means that the semiconductor layer 22 is subjected to an annealing treatment, thereby improving the properties of the semiconductor layer 22 (for example, the crystallizing of the semiconductor layer 22 or higher degree of crystallization thereof is provided). Therefore, the formation of the opening 35, the formation of the insulating layer 24 and heat-treatment of the semiconductor layer 22 can be concurrently performed by the laser irradiation (60).

More detailed explanation about the laser irradiation is as follows:

In the laser irradiation of the present invention, a pulse laser having a wave length of about 350 nm or less (for example, wave length of around 150 nm to 350 nm) may be used. Examples of such laser may include an excimer laser such as XeCl (wave length: about 308 nm), KrF (wave length: about 248 nm), and ArF (wave length: about 192 nm). The lower limit of the wave length of the laser (or a concrete range of the laser wavelength) is not particularly limited, and thus it is suitably selected depending on the properties of the material to be irradiated. From a practical point of view, the laser with its wave length capable of not adversely affecting the material to be irradiated may be used.

In a case of the laser beam which has the wave length of about 350 nm or less, the irradiating the laser beam to the plastic film can form one or more openings (or holes) not by melting the film with the heat, but by cleaving the molecules of the film. Therefore, it is suitably capable of forming a via with its small diameter size in the resin film. The laser beam which has penetrated the resin film is absorbed by the surface of the semiconductor structure portion 20 (for example, absorbed by the silicon surface of the semiconductor layer 22). The absorbed laser beam is then converted to the heat, and thus raising the temperature of the surface. Especially, since the silicon has an optical absorption range in the wavelength of about 350 nm or less, most of the laser beam with such a wavelength band can be absorbed by the silicon surface. The absorbed laser beam can excite electrons through the direct transition, and thus the excited electron can be converted to thermal energy, which raises the temperature of silicon.

In this regard, it is capable of adjusting the degree of the modified crystallinity of the silicon in the semiconductor layer by controlling the energy of the laser beam to be irradiated. In a case where the annealing is performed with the laser beam having a relatively low energy density (for example, about 100 mJ/cm$^2$ to about 200 mJ/cm$^2$), the silicon can recrystallize in the solid phase without being melted, so that the crystal size thereof will become large. While on the other hand, in a case where the annealing is performed with the laser beam having a relatively high energy density (for example, about 500 mJ/cm$^2$), the silicon is once melted and then the crystal thereof generates and grows. When the energy density of the laser beam is high, the silicon becomes the molten state, so that the modified degree of the crystallinity of the silicon increases as compared with that of a lower energy density of the laser beam.

When the pulse laser is used for the laser irradiation, it becomes easy to limit the influence of the heat induced by the annealing to the surface of the semiconductor layer (for example, the silicon surface) to which the laser being directly irradiated. In a case where the energy density of the irradiated laser beam is sufficient to provide the semiconductor layer surface with the annealing effect, the use of a continuous oscillation type laser could excessively increase the temperature of the semiconductor layer. When such excessive increase of the temperature occurs, it may cause an inconvenient problem that the resin film and/or the gate electrode could melt due to the influence of the heat. In this regard, in the case where the pulse laser is used according to the present invention, the surface of the semiconductor layer is selectively heated to the elevated temperature and annealed at the point in time when the pulse laser is irradiated, whereas it is allowed to be cooled due to the diffused heat at the point in time when the pulse laser is not irradiated. Therefore, the use of the pulse laser makes it possible to selectively heat the surface of semiconductor layer, and to reduce a spreading of the thermal effect to the other regions. The pulse width of the pulse laser may be in the range of about 1 picosecond to about 100 nanoseconds, and the laser wavelength thereof may be in the range of about 150 nm to about 350 nm.

In a case where the amorphous silicon of the semiconductor layer 22 before the laser irradiation is crystallized to be polysilicon by allowing it to be melted through the laser irradiation, the molten silicon solidifies in a short time for about 100 nanoseconds or less. In this regard, the semiconductor material (silicon) which determines the diffusion of heat and the thickness of the metal foil in contact with it can serve as a factor for affecting the crystallinity of the silicon. It is preferable to irradiate the laser beam having an energy density as high as possible, since the heat diffusion becomes faster as the thermal conductivity of the semiconductor material is higher and the thickness of metal foil is thicker.

Specifically, the conditions of the annealing treatment by the laser irradiation are suitably decided in consideration of the various factors as mentioned above. For example, using an excimer laser (XeCl) having a wave length of about 308 nm, about 100 shots to about 200 shots are irradiated with an energy-density of about 50 mJ/cm$^2$ and a pulse width of about 30 nanoseconds. This annealing treatment makes it possible to improve the degree of the crystallization of the amorphous silicon after the formation of the opening in the polyimide film is completed in a case of the silicon semiconductor layer having a thickness of about 50 nm, the resin film (i.e., polyimide film) having a thickness of about 15 μm and the copper foil as the metal foil having a thickness of about 10 μm. In other words, the laser irradiation makes it possible to convert the silicon to polysilicon having a particle size of several hundreds of micrometers in the silicon semiconductor layer.

Figure 7:
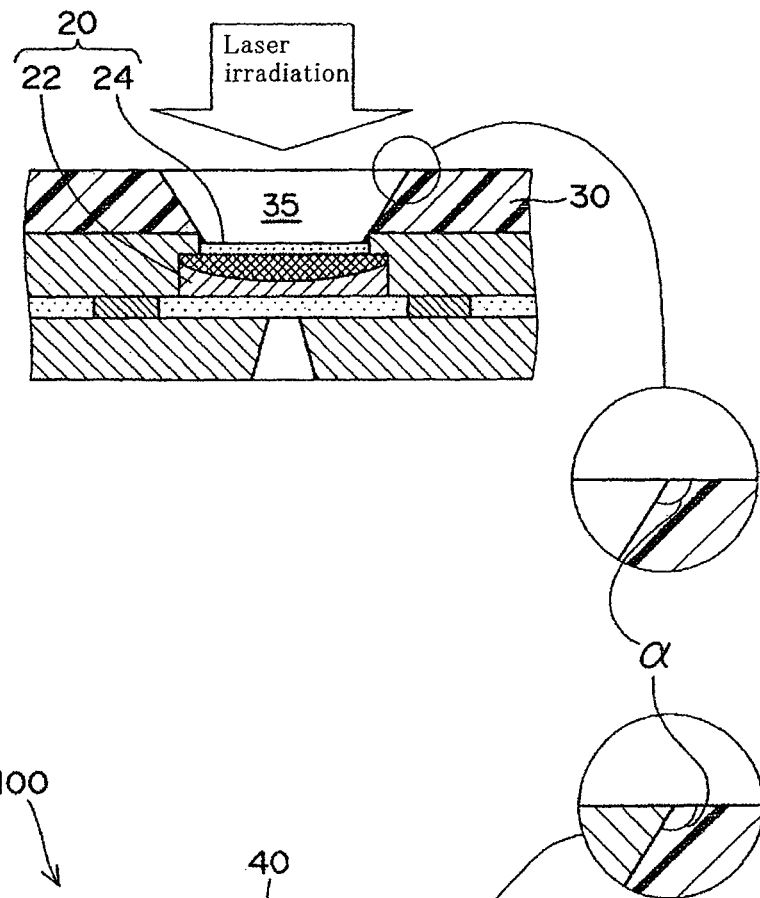
FIGS. 7(a) and 7(b) illustrate cross-sectional views illustrating the steps in a manufacturing process of a flexible semiconductor device according to an embodiment of the present invention.
Figure 7:
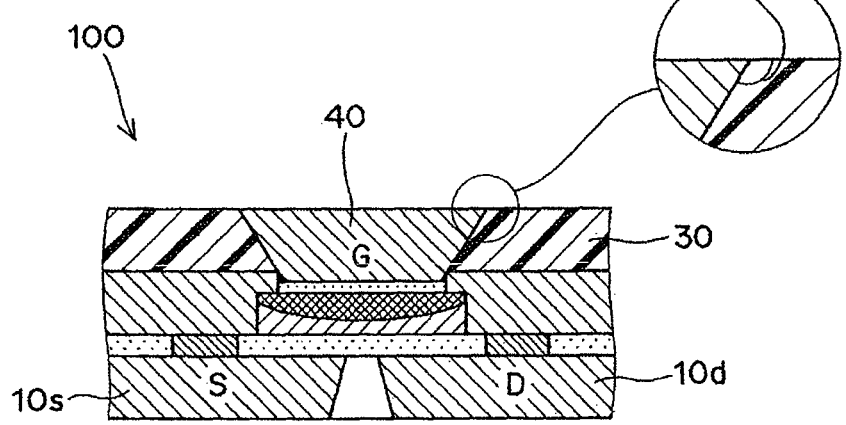

With regard to the laser irradiation, the size (diameter) of the opening 35 can be controlled to a desired size by adjusting the diameter of the laser. In this respect, the opening size (diameter) formed by the laser irradiation may be in the range of about 5 μm to about 80 μm. For example, the opening 35 may have a diameter of about 30 μm. As for the opening size (diameter), the opening 35 may be formed to have a large size in order that the larger surface of the semiconductor structure portion is heat-treated as shown in FIG. 7. In other words, the opening size may be set large so that the surface of the semiconductor structure portion 20 can be irradiated with the laser as uniformly as possible as shown in FIG. 7. This makes it possible to effectively subject the semiconductor layer region located near the extraction electrode to the annealing treatment, so that the channel region of the semiconductor layer is improved. In addition, the gate electrode 40 formed in such large opening can be located above the source and drain electrodes 10s, 10d, and thus the electric current flow characteristic of the semiconductor can be improved in the case of the large opening. As such, the large opening 35 as shown in FIG. 7 is preferred. In the meanwhile, a desired beam diameter can be provided not only by adjusting the diameter of the laser, but also by applying a mask to the laser beam.

Moreover, when the opening 35 is provided by the laser irradiation, such opening 35 can be formed in a tapered shape (namely, there can be provided so-called "earthenware mortar form" or "inverted conical form" of the opening). That is, it is capable of forming an angle between the wall surface of the opening 35 and the top face of the resin film 30 to be an obtuse angle (i.e. larger than 90 degrees). For example, the taper angle "α" as shown in FIG. 7 can be in the range of about 110° to about 160°. Comparing with the case where the angle between the wall surface of the opening 35 and the top face of the resin film 30 is the right angle (=90 degrees) (in this regard, the angle may generally become "about 90 degrees" if the opening is formed by the machining process such as drilling and the like), the tapered opening 35 enables it to facilitate the filling process of the opening 35 with an electroconductive material.

Furthermore, since the laser irradiation can be performed for the formation of the openings according to the present invention, "variation" in the formation precision thereof can be reduced. In other words, provided that a plurality of the semiconductor devices are manufactured, many openings having substantially the same size can be more accurately formed in the respective resin films of semiconductor devices. This leads to an improved efficiency of the manufacturing process.

In the present invention, an inorganic oxide film made of $SiO_2$, $Al_2O_3$ and $HfO_2$ can be suitably used as the insulating layer (gate oxide film) 24 of the semiconductor structure portion 20. Since these oxide films have a large band gap (for example, $SiO_2$: 9 eV, $Al_2O_3$: about 8 eV, $HfO_2$: about 6 eV), the wave length of excimer laser can penetrate them. Therefore, the underlying silicon can be directly annealed by the laser irradiation.

As mentioned above, the excimer laser having a short wavelength is preferable due to being efficiently absorbed by the silicon. It is however not limited thereto, and a solid state laser with continuous oscillation may also be used. The solid state laser has features in that it is superior in maintenance, and it has large power. In a case where the laser has relatively long wave length, the energy which is to be directly absorbed by the silicon become small. In light of this, it is also possible to provide a layer capable of changing the energy of the laser to heat (i.e., thermal conversion layer) between the gate insulating film 24 and the metal foil 10. As the material for the thermal conversion layer, a material may be selected from those capable of absorbing the wave length of the laser to be irradiated. For example, in a case where the green laser is used, a thermal conversion layer made of Mo or Mo alloy (e.g., an alloy of Mo and W or an alloy of Mo and Ta) may be provided between the gate insulating film 24 and the metal foil 10.

In the above explanation, the modification of the film quality of the semiconductor layer 22 in the semiconductor structure portion 20 has been described. However, the present invention is not limited to that, the film quality of the insulating layer (gate insulating film) 24 can also be modified by the laser irradiation. The laser beam used in the present invention can penetrate the gate insulating film 24 made of an inorganic oxide (e.g., $SiO_2$) depending on the wave length, and consequently the underlying silicon is heated. As a result, the inorganic oxides ($SiO_2$ and the like) can be heated with the resulting heat of the underlying silicon. When such a treatment is carried out under an oxygen atmosphere (for example, under an air atmosphere), the film quality of the oxide film can be improved.

For example, the electron trap state of the oxide film ($SiO_2$) produced by the thermal oxidation (wet oxidation) in the steam can be decreased. Further explained, the wet oxidation is preferred since the productivity is superior due to an oxidizing velocity being about 10 times as high as that of the dry oxidation. But, the wet oxidation has a tendency that the electron trap state increases. While on the other hand, the dry oxidation has so much hole traps, in spite that the generation of the electronic trap level is low. Accordingly, a gate oxide film 24 having fewer electron traps and hole traps can be produced with sufficient productivity by performing, under an oxygen atmosphere, the laser irradiation of the oxide film produced by the wet oxidation.

In the above explanation, the examples of the improvement of the properties of the silicon semiconductor due to the laser irradiation have been explained. However, the properties of the semiconductor can be improved similarly, even in a case where the oxide semiconductor is used instead of the silicon semiconductor. For example, in a case of the crystalline oxide semiconductor such as ZnO, there is many amorphous layers in the crystal layer immediately after being formed as a film by a sputtering and the like, thereby frequently failing to show the property of the semiconductor device. However, according to the present invention, the crystallinity of the oxide semiconductor such as ZnO can be improved, which leads to an achievement of the improved semiconductor characteristic.

Further in detail, when ZnO is formed by the RF magnetron sputtering method in the order of ZnO (50 nm) and $SiO_2$ (50 nm) instead of the above-mentioned silicon semiconductor, the mobility shows only the low value of 1 $cm^2$/Vs or less before the excimer laser irradiation. While on the other hand, when irradiation with XeCl excimer laser is performed, it can afford to improve the mobility of the semiconductor to be about 20 $cm^2$/Vs.

In addition, the effect of improving the semiconductor properties can also be provided as for the amorphous oxide semiconductor such as InGaZnO. In the case of the amorphous oxide semiconductor, an oxygen deficiency can be restored, and as a result the mobility can be improved due to the laser irradiation of the present embodiment under the oxygen atmosphere (for example, air atmosphere). In a case where the oxide film made of $SiO_2$, $Al_2O_3$ and the like is provided as the gate insulating film 24, the oxygen deficiency of the amorphous oxide semiconductor is restored by the oxygen supplied from the opening 35 to the amorphous oxide semiconductor through the gate insulating film 24. When the TFT is produced using InGaZnO as the semiconductor, the low mobility of 1 $cm^2$/Vs or less before laser irradiation can be improved to the degree of about 10 $cm^2$/Vs after the laser irradiation.

Hereinafter, another construction of the flexible semiconductor device according to the present invention and the production method therefor will be described with reference to FIG. 8, FIGS. 9(a) to 9(c) and FIGS. 10(a) to 10(c).

Figure 8:
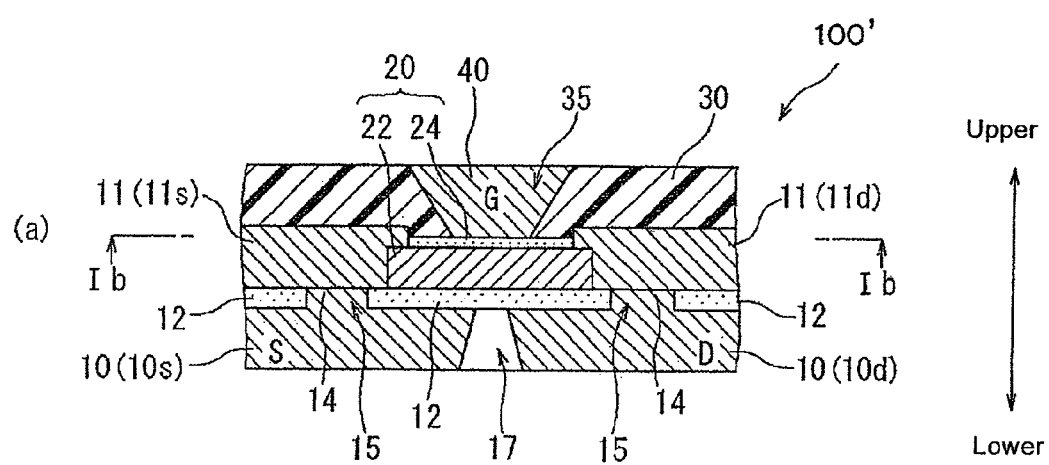
FIG. 8 illustrates a cross sectional view of the structure of another flexible semiconductor device according to an embodiment of the present invention.

In the flexible semiconductor device 100' according to this embodiment, as shown in FIG. 8, one or more parts of the surface of the support layer 10 correspond to the via openings 15, thereby the interlayer connecting portions 14 are provided therein. Particularly in the flexible semiconductor device 100', the upper parts of the metal foil 10 serving as the support layer are oxidized, thereby the oxide film of the metal foil 10 is formed as the insulating film 12.

Figure 9:
FIGS. 9(a) to 9(c) illustrate cross-sectional views illustrating the steps in a manufacturing process of another flexible semiconductor device according to an embodiment of the present invention.
Figure 9:
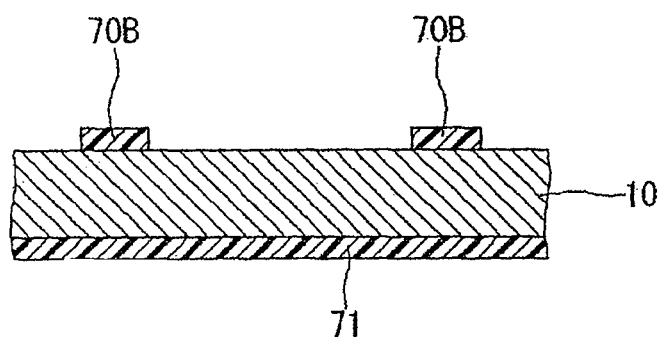
Figure 9:
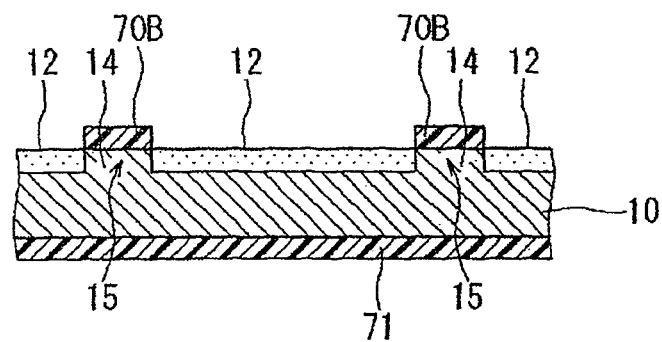
Figure 10:
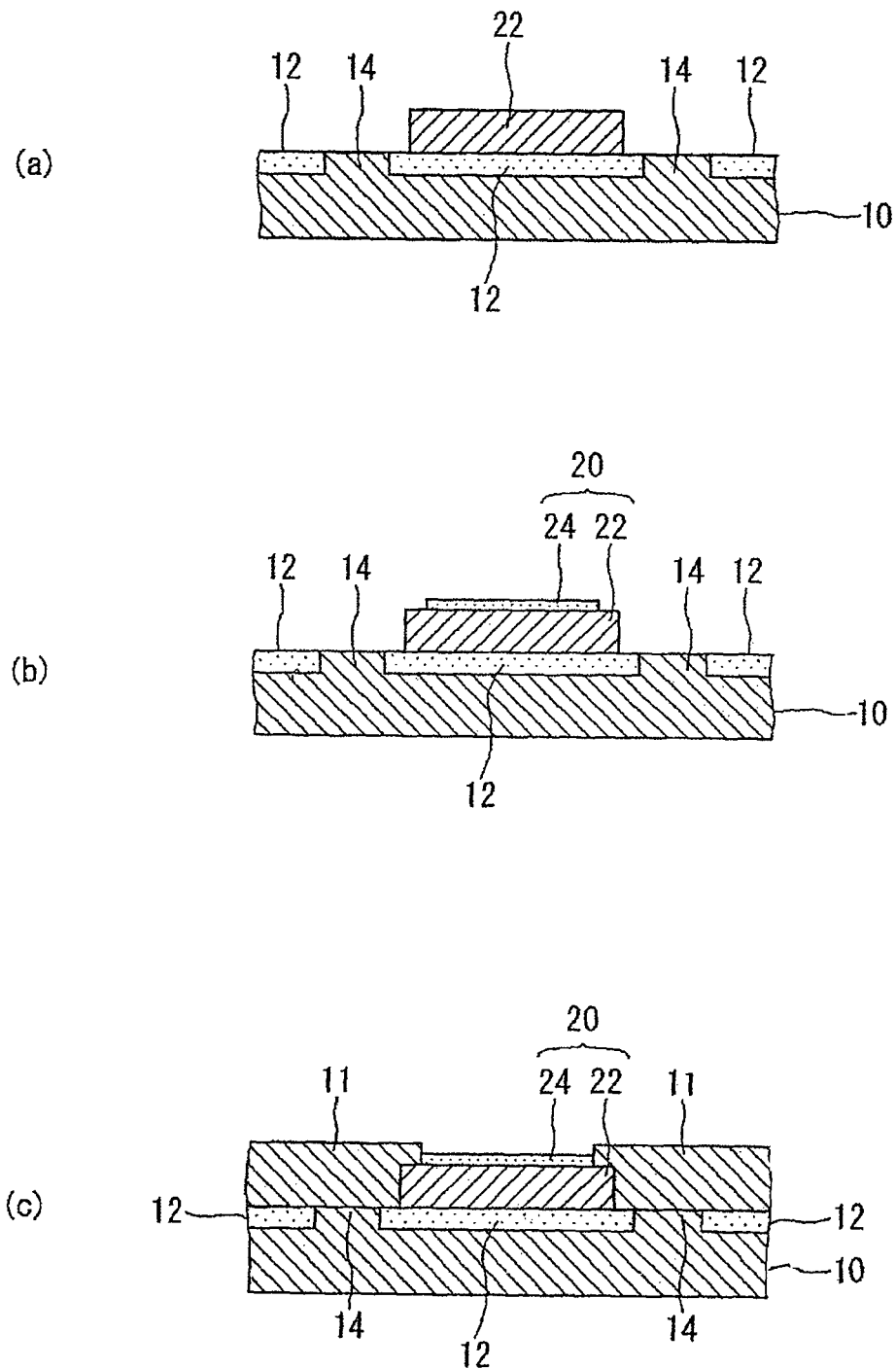
FIGS. 10(a) to 10(c) illustrate cross-sectional views illustrating the steps in a manufacturing process of another flexible semiconductor device according to an embodiment of the present invention.

The production method of the flexible semiconductor device 100' will be explained with reference to FIGS. 9(*a*) to 9(*c*) and FIGS. 10(*a*) to 10(*c*). First, as shown in FIG. 9(*a*), a metal foil 10 serving as a support layer is provided. Then, as shown in FIG. 9(*b*), resist layers 70B are formed at the region where vias 14 are to be formed on the surface of the metal foil 10. In the illustrated embodiment of the FIG. 9(*b*), the resist layer 71 is also formed on the whole bottom surface of the metal foil 10 in addition to the resist layers 70B formed on the top face of the metal foil 10.

Next, as shown in FIG. 9(*c*), the surface of the metal foil 10 is oxidized with the resist layers 70B serving as a mask, and thereby an insulating film 12 is formed. When the metal foil 10 consists of an aluminum foil, the insulating film 12 can consist of aluminum oxide. As the oxidation process of the metal foil 10, for example, any suitable processes such as anodic oxidation process, thermal oxidation process (surface oxidation by the heating treatment), and chemical oxidation process (surface oxidation by an oxidizing agent) can be performed. The portions on the metal foil 10 which are not oxidized (non-oxidized portions) serve as the openings 15 of the insulating film 12, and the parts within the openings 15 serve as the vias (interlayer connecting portions) 14. After the oxidation process is completed, the resist layers 70B and 71 are removed.

As the metal of the metal foil 10 serving as the support layer, a metal with a good electrical conductivity and capable of easily forming a dense oxide is preferable. For example, a valve metal may be used as the metal of the metal foil 10. Examples of such valve metal include at least one kind of metal selected from the group consisting of aluminum, tantalum, niobium, titanium, hafnium, zirconium, molybdenum and tungsten and an alloy thereof. For example, the metal foil 10 is an aluminum foil. The thickness of the metal foil 10 is preferably in the range of about 2 μm to about 100 μm, for example about 12 μm.

The surface oxidation treatment of the metal foil 10 made of a valve metal (for example, aluminum) is performed by the anodic oxidation. The method for the aluminum anode oxidation is not particularly limited. Any suitable chemical conversion liquids may be used for the anodic oxidation. For example, the anodic oxidation may be performed by immersing a cathode and the metal foil 10 which functions as the anode into a chemical conversion solution, and subsequently connecting both the cathode and the anode with a constant current source, and thereby applying a desired voltage thereto. For example, the condition of applied current voltage may include the current density ranging from about 1 to about 10 mA/cm$^2$ and the voltage ranging from about 50 to about 600 V. Such anodic oxidation can produce a surface metal oxidation layer with its thickness of about 800 nm or less on the surface of metal foil.

The metal foil 10 is not limited to the aluminum foil, but the metals thereof are those capable of providing an oxide film which is uniformly coated on the surface thereof by an oxidation. Therefore, a metal other than the valve metal may be used. In this sense, the oxidation method of the metal foil 10 can be performed by a thermal oxidation (surface oxidation by heating treatment) or chemical oxidation (surface oxidation by an oxidizing agent) instead of the anodic oxidation.

The procedures after forming the insulating film 12 are substantially the same as those explained relating to FIG. 3(*a*) and the followings. That is, as shown in FIG. 10(*a*), the semiconductor layer 22 is formed on the metal foil 10. Then, as shown in FIG. 10(*b*), the insulating layer 24 is formed on the semiconductor layer 22. This insulating layer 24 may function as a gate insulating film in the flexible semiconductor device 100'. Thereafter, as shown in FIG. 10(*c*), one or more extraction electrodes 11 are formed on the metal foil 10 on the surface of which the insulating layer 12 is provided. A part of each extraction electrode 11 is located at the positions above the via 14. Then, the procedures as shown in FIGS. 4(*a*) to 4(*c*) are carried out.

Through the above steps, there can be finally obtained the flexible semiconductor device 100' having the construction as shown in FIG. 8.

Hereinafter, further another construction of the flexible semiconductor device of the present invention and the production method therefor will be described with reference to FIGS. 11(*a*) to 11(*c*) and FIGS. 12(*a*) to 12(*c*). The flexible semiconductor device 100" according to this embodiment has the structure with no extraction electrode 11 as shown in FIG. 12(*c*).

First, the procedures as mentioned above with reference to FIGS. 2(*a*) to 2(*c*) are carried out. Specifically, the vias 14 are formed within the via openings 15 after removing the resist coatings 70A and 71 from the structure shown in FIG. 2(*b*). Then, as shown in FIG. 11(*a*), the semiconductor layer 22 is formed on the metal foil 10 serving as the support layer. In this regard, the semiconductor layer 22 is electrically connected to the metal foil 10 through the vias 14.

Figure 11:
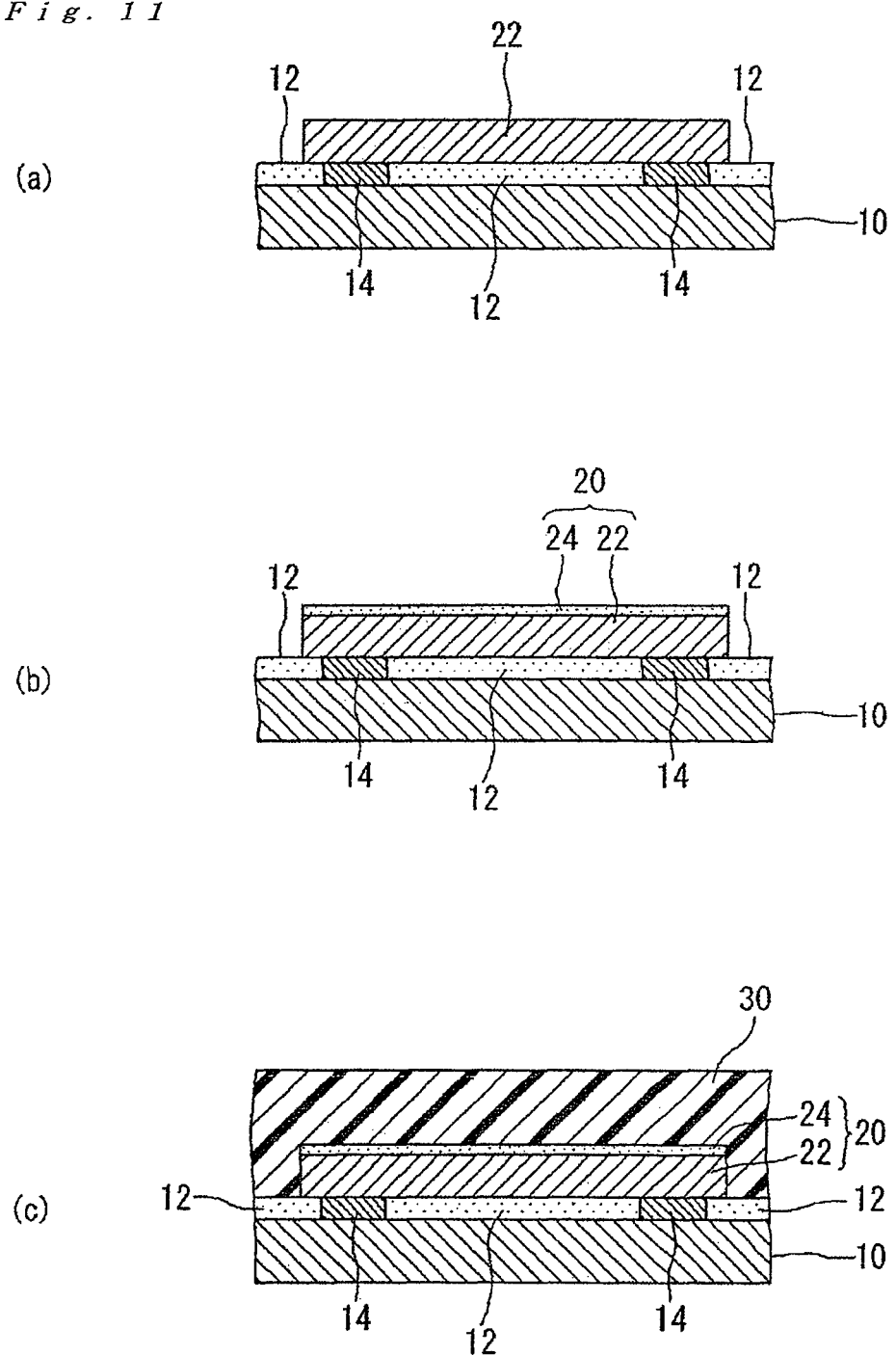
FIGS. 11(a) to 11(c) illustrate cross-sectional views illustrating the steps in a manufacturing process of another flexible semiconductor device according to an embodiment of the present invention.
Figure 12:
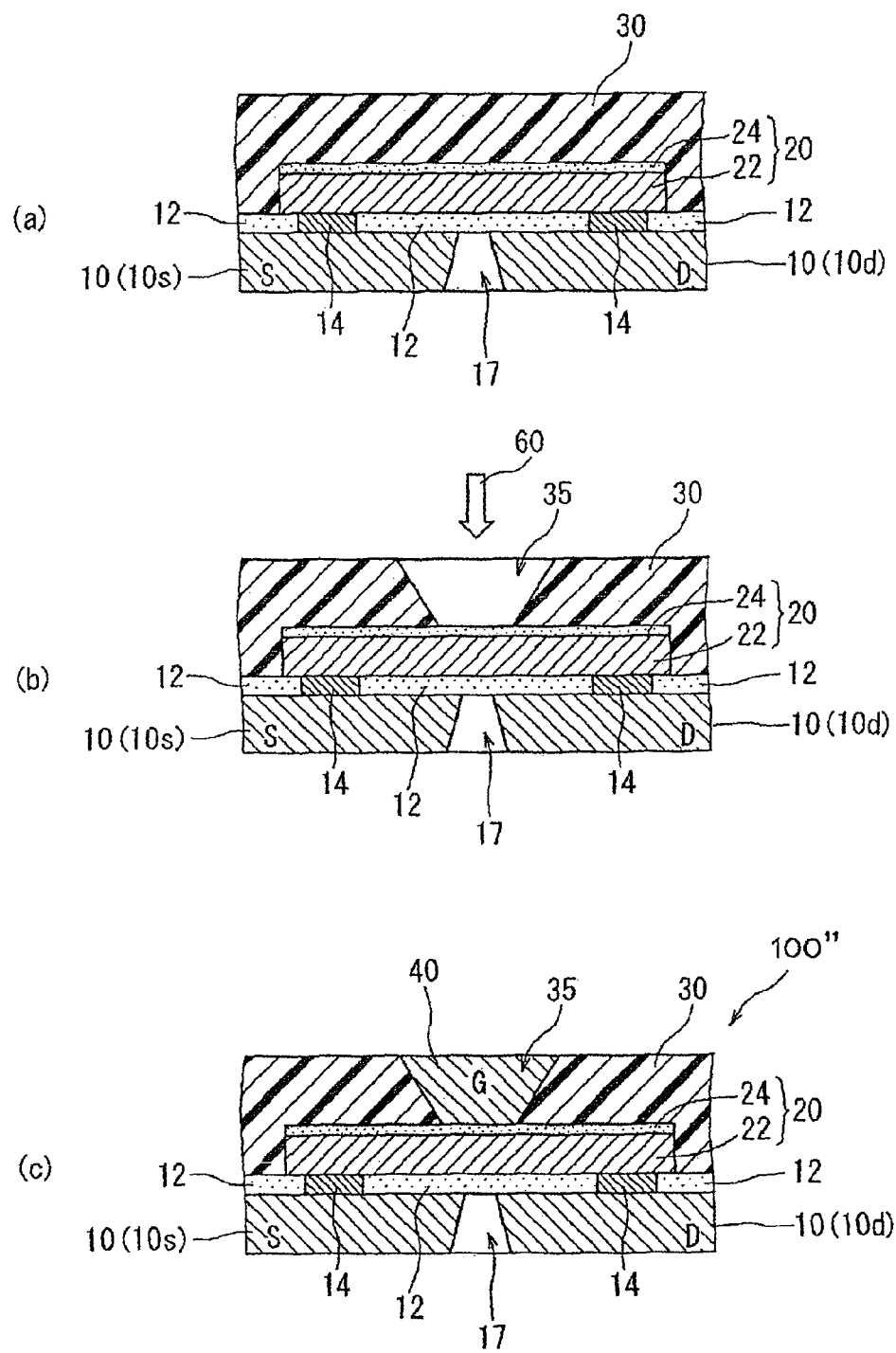
FIGS. 12(a) to 12(c) illustrate cross-sectional views illustrating the steps in a manufacturing process of another flexible semiconductor device according to an embodiment of the present invention.

Alternatively, it is capable of performing the procedures shown in FIGS. 9(*a*) to 9(*c*), followed by removing the resist layers 70B and 71 from the structure shown in FIG. 9(*c*), followed by forming the semiconductor layer 22 on the support layer 10 containing the vias 14 as shown in FIG. 11(*a*). Even in this case, the semiconductor layer 22 is configured to be electrically connected to the support layer 10 through the vias 14.

Next, as shown in FIG. 11(*b*), the insulating layer 24 is formed on the semiconductor layer 22. This insulating layer 24 may function as a gate insulating film in the flexible semiconductor device 100". In this regard, as shown in FIG. 11(*b*), the stacking structure containing the semiconductor layer 22 and the insulating layer 24 corresponds to the semiconductor structure portion 20.

Next, as shown in FIG. 11(*c*), the resin film 30 is formed on the metal foil 10 so as to cover the semiconductor structure portion 20. Subsequently, as shown in FIG. 12(*a*), the metal foil 10 serving as the support layer is subjected to a patterning treatment, thereby forming the source electrode 10*s* and the drain electrode 10*d* from the metal foil 10. In the illustrated embodiment of FIG. 12(*a*), a part of the support layer 10 is etched away to form the opening 17, so that the source electrode 10*s* and the drain electrode 10*d* are separated mutually.

Next, as shown in FIG. 12(*b*), the opening 35 through which the surface of the semiconductor structure portion 20 is exposed is formed by irradiating the resin film 30 with a laser (60). Specifically, as explained with reference to FIG. 4(*c*), the resin film 30 is subjected to a hole forming process by the laser irradiation (60) to expose the surface of the insulating layer 24. By this laser irradiation (60), the heat is transmitted to the semiconductor structure portion 20, thereby making it possible to subject the semiconductor structure portion 20 to the annealing treatment. That is, the film quality of the semiconductor structure portion 20 is modified by the laser irradiation process. For example, the degree of the crystallization of the semiconductor layer 22 in the semiconductor structure portion 20 can be improved, or the crystallinity of the semiconductor layer 22 can be changed from the amorphous state to the polysilicon state.

Then, as shown in FIG. 12(*c*), the gate electrode 40 is formed by filling up the laser opening 35 with an electroconductive material. Through the above steps, there can be finally obtained the flexible semiconductor device 100" with the construction as shown in FIG. 12(c).

Figure 13:
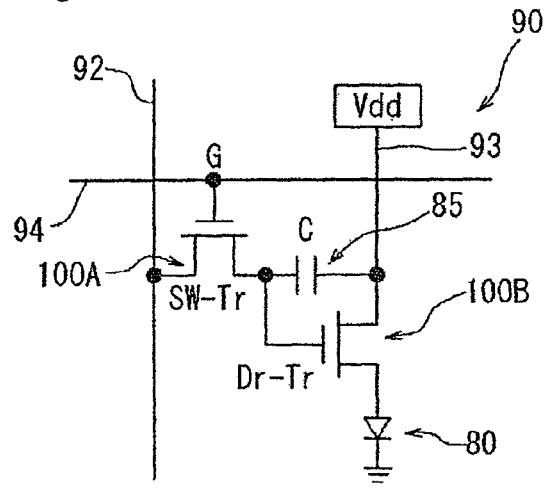
FIG. 13 illustrates a circuit diagram in a drive circuit of an image display device according to an embodiment of the present invention.
Figure 14:
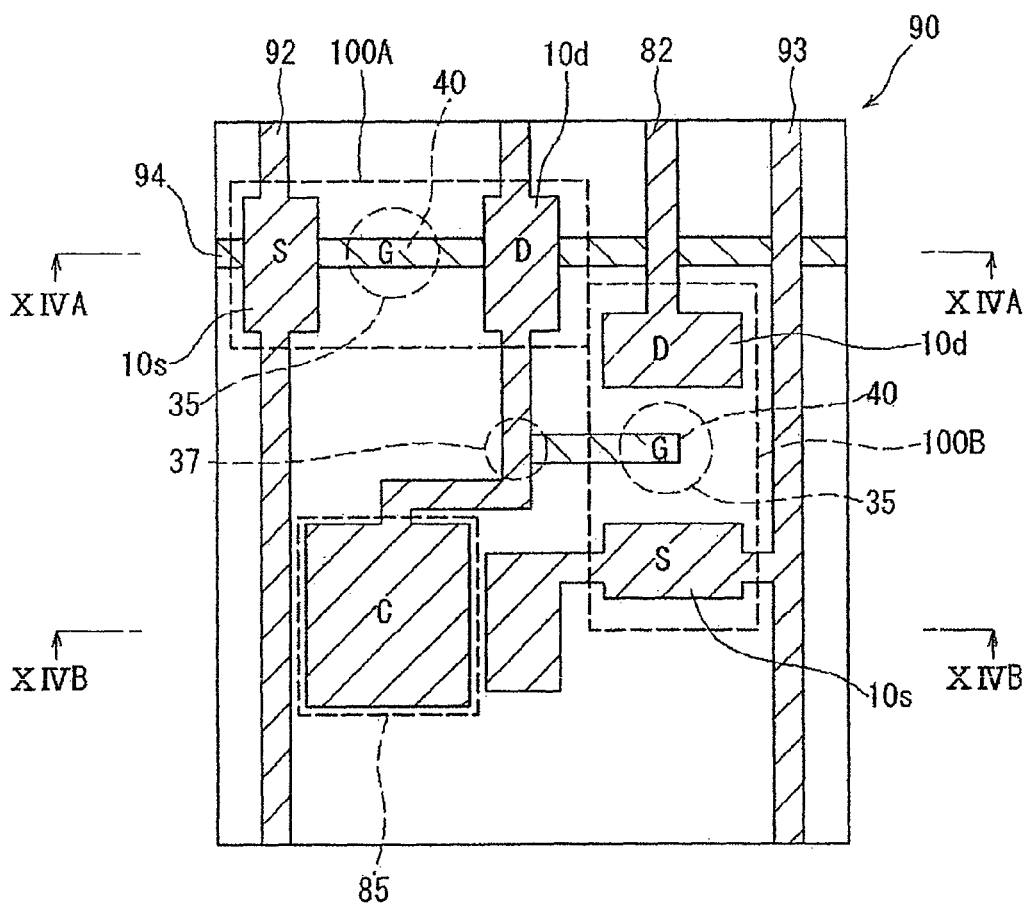
FIG. 14 illustrates a plan view of a drive circuit of an image display device, the circuit being constructed by the flexible semiconductor device 100.
Figure 15:
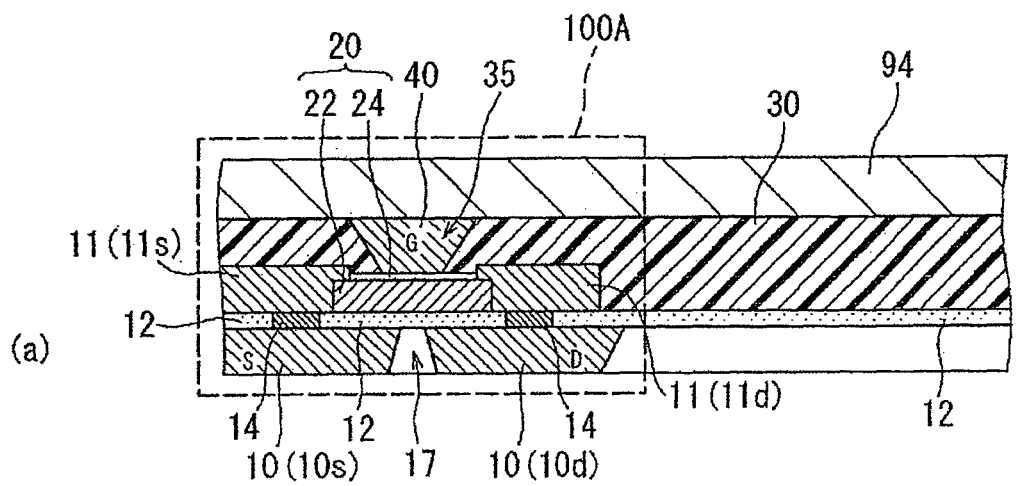
FIG. 15(a) illustrates a cross sectional view taken along line XIVA-XIVA of FIG. 14.
FIG. 15(b) illustrates a cross sectional view taken along line XIVB-XIVB of FIG. 14.
Figure 15:
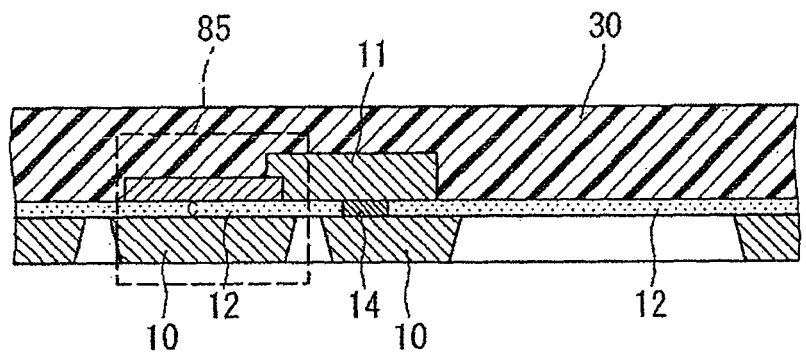

Hereinafter, the embodiment of mounting the flexible semiconductor devices 100, 100' and 100" of the present invention on an image display device will be described with reference to FIGS. 13 to 15. FIG. 13 is a circuit diagram for explaining the drive circuit 90 of an image display device. FIG. 14 is a plan view in which the drive circuit is constituted by the flexible semiconductor device 100 of the present embodiment. FIGS. 15(a) and 15(b) each shows the cross-sectional view taken along lines XIVA-XIVA and XIVB-XIVB in FIG. 14, respectively.

The circuit 90 shown in FIG. 13 is a drive circuit mounted on the image display device (for example, organic electroluminescence display), and herein shows a construction of one pixel in the image display device. Each pixel of the image display device of this example consists of a circuit including the combination of two transistors (100A, 100B) and one capacitor 85. This drive circuit comprises a switching transistor 100A (hereinafter, referred to as "Sw-Tr") and a driving transistor 100B (hereinafter, referred to as "Dr-Tr"). Each transistor (100A, 100B) is constituted by any of the flexible semiconductor devices 100, 100', and 100" of the present invention. As will be described later, the capacitor 85 may be formed in a part of each of the flexible semiconductor devices 100, 100', and 100".

The gate electrode of Sw-Tr 100A is connected to the selection line 94. Moreover, as for the source electrode and the drain electrode of Sw-Tr 100A, one electrode is connected to a data line 92, whereas the other electrode is connected to a gate electrode of Dr-Tr 100B. Furthermore, as for the source electrode and the drain electrode of Dr-Tr 100B, one electrode is connected to the power source line 93, whereas the other electrode is connected to the display (here, an organic EL device) 80. Moreover, the capacitor 85 is connected between the source electrode and the gate electrode of Dr-Tr 100B.

In the pixel circuit of the above-mentioned construction, when the switch of Sw-Tr 100A is set to ON while the selection line 94 is in operation, a driver voltage comes to be entered from the data line 92. When it is selected by Sw-Tr 100A, a voltage is applied to the gate electrode of Dr-Tr 100B. The drain current corresponding to the voltage is supplied to the display 80, thereby the display (organic EL device) 80 is caused to emit light. When the voltage is applied to the gate electrode of Dr-Tr 100B, electric charge is stored in the capacitor 85. This charge plays the role (retention volume) which continues applying voltage to the gate electrode of Dr-Tr 100B over fixed time, even after the selection by Sw-Tr 100A is canceled.

FIG. 14 is a plan view of the flexible semiconductor device in which a part of the circuit 90 shown in FIG. 13 is formed. FIG. 14 shows a planar perspective view of the wiring layers (two layers). In FIG. 14, in order to facilitate the understanding of the wiring pattern, the lower side of the layers of FIGS. 15(a) and 15(b) is shown as the upper side, and the upper side of the layers of FIGS. 15(a) and 15(b) is shown as the bottom side.

Although it does not appear in the cross section in FIGS. 15(a) and 15(b), the vias 37 correspond to the interlayer connection components which serve to connect the upper layer and the lower layer with each other. These vias 37 are paste vias, for example. The paste vias 37 can be formed by using of the mixture of Ag powder and the resin composition which contains an epoxy resin as the main component thereof. The opening for the paste via 37 can be formed by, for example, the laser beam. With regard to the use of the laser beam, it matches well since the laser beam can be used also in the process shown with reference to FIG. 4(c), for example. Particularly when the opening for the via 37 and the laser opening 35 are formed in the same layer (or in the same resin film), the laser opening 35 and the opening for the via 37 can be formed in the same process, and thereby providing a superior productivity. As for the via 37, not only paste via but also the plating via can be used.

FIG. 15(a) shows a cross-section structure of the flexible semiconductor device (Sw-Tr) 100A (cross section taken along line XIVA-XIVA), and FIG. 15(b) shows a cross-section structure of the capacitor 85 (cross section taken along line XIVB-XIVB). Although the cross-section structure of the flexible semiconductor device (Dr-Tr) 100B is not shown, it shows substantially the same cross-section as that shown in FIG. 12(a). The drain electrode 10d of the flexible semiconductor device (Dr-Tr) 100B is connected to the wiring 82 connected to the display (organic EL element) 80.

As shown in the circuit 90 of FIG. 13, the capacitor 85 which stores capacity (or somewhat amount of charge) is required in the drive circuit capable of driving an image display device. In the construction shown in FIG. 15, the capacitor 85 is built in a part of the substrate structure, thus it is not necessary to arrange a capacitor 85 separately in the exterior of the substrate structure. Therefore, it is possible to provide an image display device having a small size and high density mounting efficiency.

Although the circuit 90 is provided by arranging the flexible semiconductor devices 100A and 100B in the same layer in the embodiment shown in FIGS. 14 and 15, it is capable of arranging them respectively in layers different from each other.

Figure 16:
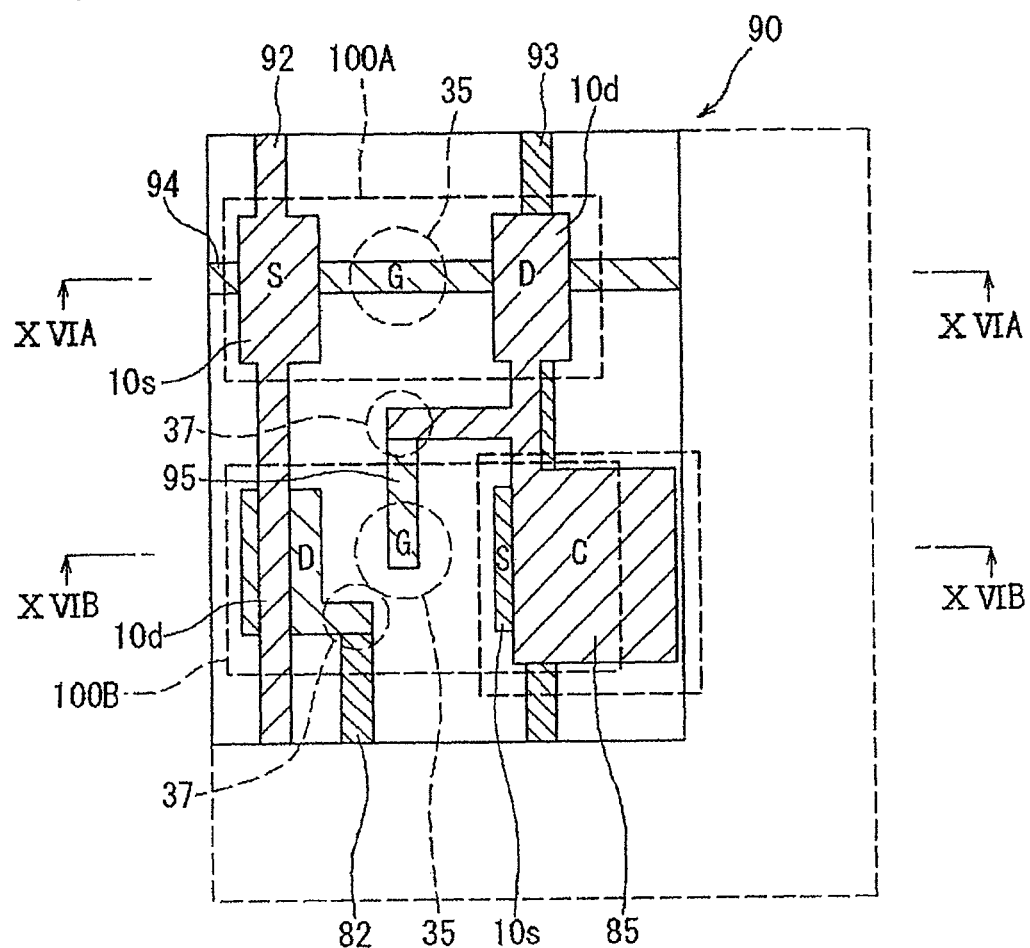
FIG. 16 illustrates a plan view of a multilayer-type substrate structure wherein the flexible semiconductor device 100A and the flexible semiconductor device 100B are respectively located on different layers.
Figure 17:
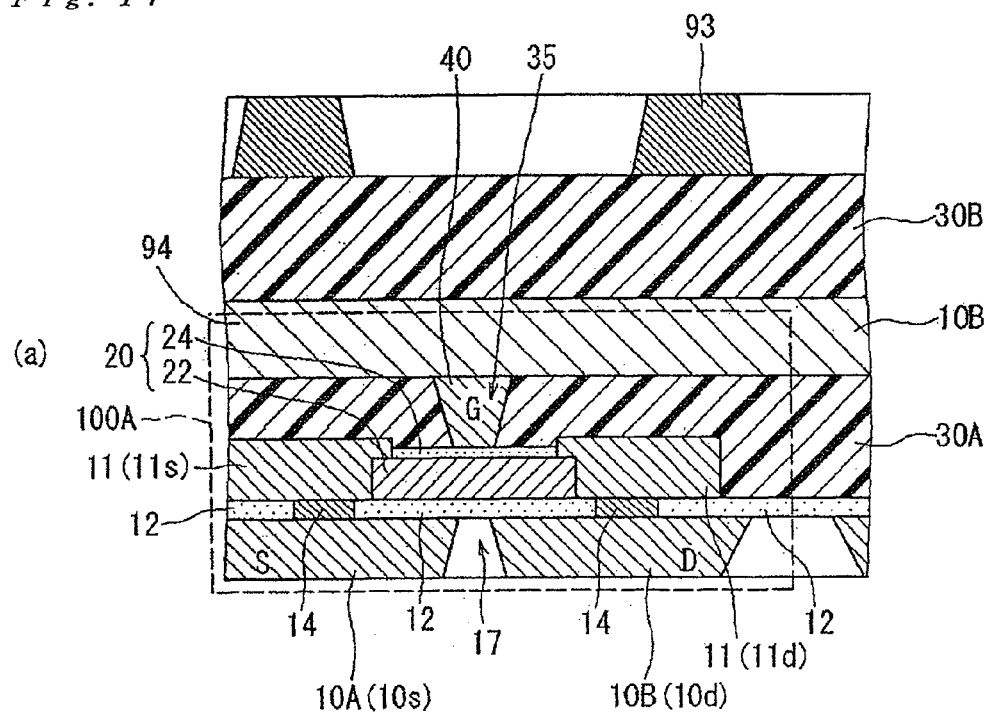
FIG. 17(a) illustrates a cross sectional view taken along line XVIA-XVIA of FIG. 16.
FIG. 17(b) illustrates a cross sectional view taken along line XVIB-XVIB of FIG. 16.
Figure 17:
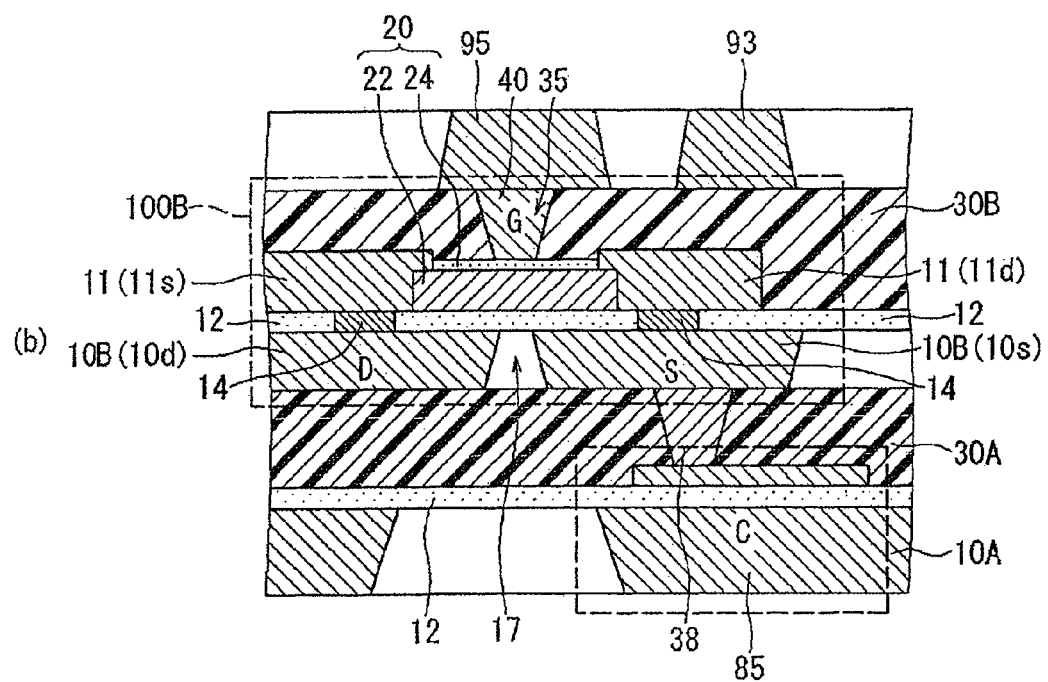

FIG. 16 shows a stacking substrate structure wherein the flexible semiconductor devices 100A and 100B are arranged in different layers. The cross sections taken along the lines XVIA and XVIB of FIG. 16 are shown in FIGS. 17(a) and 17(b), respectively. FIG. 16 is a planar perspective view showing a taken-out part of the wiring layers having three layers. Similar to FIG. 14, in order to facilitate the understanding of the wiring pattern, the lower side of the layers of FIGS. 17(a) and 17(b) is shown as the upper side in FIG. 16, and also the upper side of the layers of FIGS. 17(a) and 17(b) is shown as the bottom side in FIG. 16.

According to the stacking substrate structure shown in FIG. 16, the wiring can be three dimensionally arranged, thereby the length of the wiring lines can be shortened and also accommodating many wirings within the same element area. Therefore, it is possible to attain a high density mounting, and also to provide an advantageous effects resulted from the shortened length of the wiring lines (such as less voltage drop, easy transmission of a high speed signal, and reduced EMC noise emission).

In the meanwhile, the opening 35 filled with the gate electrode 40 shown in FIG. 17(a) and the opening filled with the via 38 shown in FIG. 17(b) are formed in the same layer (in the resin film 30A). Therefore, such a plurality of openings can be formed in substantially the same process (step) by performing the laser irradiation.

In general, the present invention as described above includes the following aspects:

The first aspect: A flexible semiconductor device with a flexible resin film therein, the device comprising
    a support layer;
    a semiconductor structure portion formed on the support layer; and a resin film formed over the support layer such that the semiconductor structure portion is covered with the resin film, wherein the resin film comprises an opening formed therein, and wherein an electroconductive member which is in contact with the surface of the semiconductor structure portion is disposed within the opening of the resin film.

The second aspect: The flexible semiconductor device according to the first aspect, wherein the opening of the resin film is a laser opening formed by a laser irradiation.

The third aspect: The flexible semiconductor device according to the first or second aspect, wherein the opening of the resin film has an obtuse-angle shape wherein a wall surface of the opening of the resin film forms an obtuse angle with respect to the top surface of the resin film.

The fourth aspect: The flexible semiconductor device according to any one of the first to third aspects, wherein the semiconductor structure portion comprises a semiconductor layer comprising a semiconductor material, and an insulating layer formed on the surface of the semiconductor layer, wherein at least a part of the insulating layer serves as a gate insulating film; and wherein at least a part of the electroconductive member serves as a gate electrode.

The fifth aspect: The flexible semiconductor device according to the fourth aspect, wherein the semiconductor layer comprises a silicon, and the insulating layer consists of a silicon oxide film.

The sixth aspect: The flexible semiconductor device according to the fourth aspect, wherein the semiconductor layer comprises an oxide semiconductor material.

The seventh aspect: The flexible semiconductor device according to the sixth aspect, wherein the oxide semiconductor material is ZnO or InGaZnO.

The eighth aspect: The flexible semiconductor device according to the fifth aspect, wherein the semiconductor layer has a carrier mobility of about 3 $cm^2/Vs$ to about 300 $cm^2/Vs$ due to the heating treatment induced by the laser irradiation of the semiconductor structure portion.

The ninth aspect: The flexible semiconductor device according to any one of the first to eighth aspects, wherein the support layer is made of a metal foil, an insulating film is formed on the metal foil, and the semiconductor structure portion is provided on the insulating film.

The tenth aspect: The flexible semiconductor device according to the ninth aspect, wherein the metal foil comprises a portion serving as a source electrode and a portion serving as a drain electrode, both of which are electrically connected with the semiconductor structure portion.

The eleventh aspect: The flexible semiconductor device according to any one of the first to tenth aspects, wherein the resin film comprises at least one kind of resin selected from the group consisting of an epoxy resin, a polyimide resin, an acrylic resin, a polyethylene terephthalate resin, a polyethylenenaphthalate resin, a polyphenylene sulfide resin, a polyphenylene ether resin and a polytetrafluoroethylene.

The twelfth aspect: The flexible semiconductor device according to any one of the first to eleventh aspects, wherein the semiconductor structure portion is one which has been subjected to an annealing treatment due to the laser irradiation.

The thirteenth aspect: The flexible semiconductor device according to any one of the first to twelfth aspects, wherein the opening for the provision of the electroconductive member (i.e., the opening through which the surface of the semiconductor structure portion is exposed at the point in time when the manufacturing process of the device is carried out) and the opening for the provision of the interlayer connecting portion are formed in the same resin layer.

The fourteenth aspect: A method for manufacturing a flexible semiconductor device comprising the steps of:

(i) forming a semiconductor structure portion comprising a semiconductor layer on a metal foil serving as a support layer;

(ii) forming a resin film over the metal foil so that the resin film covers the semiconductor structure portion;

(iii) irradiating the resin film with a laser, and thereby forming an opening in the resin film wherein the surface of the semiconductor structure portion is exposed through the resulting opening; and (iv) forming an electroconductive member such that it comes into contact with the exposed surface of the semiconductor structure portion, said exposed surface being exposed through the opening of the resin film.

The fifteenth aspect: The method for manufacturing a flexible semiconductor device according to the fourteenth aspect, wherein the laser irradiation of the step (iii) not only forms the opening in the resin film, but also subjects the semiconductor structure portion (especially the surface of the semiconductor structure portion) to a heat treatment.

The sixteenth aspect: The method for manufacturing a flexible semiconductor device according to the fourteenth or fifteenth aspect, wherein the laser irradiation of the step (iii) subjects the semiconductor structure portion to an annealing treatment.

The seventeenth aspect: The method for manufacturing a flexible semiconductor device according to any one of the fourteenth to sixteenth aspects, wherein the laser irradiation of the step (iii) modifies a film quality of the semiconductor structure portion.

The eighteenth aspect: The method for manufacturing a flexible semiconductor device according to the seventeenth aspect, wherein the modification of the film quality of the semiconductor structure portion is an improvement of the crystallinity of the semiconductor layer.

The nineteenth aspect: The method for manufacturing a flexible semiconductor device according to any one of the fourteenth to eighteenth aspects, wherein the semiconductor structure portion comprising a semiconductor layer consisting of a semiconductor material and an insulating layer formed on the surface thereof is formed in the step (i);

wherein at least a part of the insulating layer of the semiconductor structure portion serves as a gate insulating film; and wherein the electroconductive member is formed as a gate electrode in the step (iv).

The twentieth aspect: The method for manufacturing a flexible semiconductor device according to the nineteenth aspect, wherein the laser irradiation of the step (iii) subjects the insulating layer of the semiconductor structure portion to a heat treatment.

The twenty-first aspect: The method for manufacturing a flexible semiconductor device according to the nineteenth or twentieth aspect, wherein the laser irradiation of the step (iii) modifies a film quality of the insulating layer formed on the surface of the semiconductor layer in the semiconductor structure portion.

The twenty-second aspect: The method for manufacturing a flexible semiconductor device according to any one of the nineteenth to twenty-first aspects, wherein a silicon-comprising layer is formed as the semiconductor layer, and a silicon oxide film is formed as the insulating layer.

The twenty-third aspect: The method for manufacturing a flexible semiconductor device according to any one of the fourteenth to twenty-first aspects, wherein an oxide semiconductor material-comprising layer is formed as the semiconductor layer; and the laser irradiation of the step (iii) is performed under an oxygen atmosphere.

The twenty-fourth aspect: The method for manufacturing a flexible semiconductor device according to any one of the fourteenth to twenty-third aspects, wherein a pulse laser is used for the laser irradiation of the step (iii).

The twenty-fifth aspect: The method for manufacturing a flexible semiconductor device according to any one of the fourteenth to twenty-fourth aspects, wherein an insulating film is formed on the metal foil; and the semiconductor structure portion is formed on the insulating film.

The twenty-sixth aspect: The method for manufacturing a flexible semiconductor device according to any one of the fourteenth to twenty-fifth aspects, wherein the insulating film provided on the metal foil is formed by oxidizing a surface portion of the metal foil.

The twenty-seventh aspect: The method for manufacturing a flexible semiconductor device according to the twenty-sixth aspect, wherein the metal foil is a valve metal foil, and such valve metal foil is anodically oxidized to produce the insulating film therefrom on the metal foil.

The twenty-eighth aspect: The method for manufacturing a flexible semiconductor device according to any one of the fourteenth to twenty-seventh aspects, wherein the metal foil is subjected to an etching treatment, and thereby forming a source electrode and a drain electrode from the metal foil.

The twenty-ninth aspect: The method for manufacturing a flexible semiconductor device according to any one of the fourteenth to twenty-eighth aspects, wherein not only the opening through which the surface of the semiconductor structure portion is exposed, but also the opening for the provision of the interlayer connecting portion is formed by substantially the same process in the step (iii).

The thirtieth aspect: The method for manufacturing a flexible semiconductor device according to any one of the fourteenth to twenty-ninth aspects, wherein the insulating layer is formed on the surface of the semiconductor layer by the laser irradiation of the step (iii)

Although a few embodiments of the present invention have been hereinbefore described, the present invention is not limited to these embodiments. It will be readily appreciated by those skilled in the art that various modifications are possible without departing from the scope of the present invention. For example, the following modified embodiments are possible.

Each pixel may comprise not only two TFT elements (the first TFT element and the second TFT element) but also more than two elements depending on the constructional design of the display. As a result, the flexible semiconductor device of the present embodiment may be modified according to such constructional design.

In each of the above embodiments, although the present invention has been described with respect to the flexible semiconductor device which is mounted on an organic EL display, the flexible semiconductor device of the present invention may be mounted on an inorganic EL display. Moreover, the flexible semiconductor device may be mounted not only on the EL display but also on an electronic paper. Furthermore, it is possible that the flexible semiconductor device of the present invention is mounted not only on the display device but also on communication facilities (e.g., RFID), memories and so on.

The several embodiments wherein each one flexible semiconductor device is manufactured in the form corresponding to one device have been described above. The present invention is not limited to those embodiments. The present invention can be performed such that the flexible semiconductor devices are manufactured in the form corresponding to two or more devices. As an example of such manufacturing form, a roll-to-roll process may be adopted.

The flexible semiconductor device of the present invention may be one with a double-gated structure. In this case, a wider sized opening 17 of the metal foil 10 than that of FIG. 1 is formed, and a gate electrode (second gate electrode) is formed such that it comes into contact with the insulating film 12 while preventing it from coming into contacting with the source and drain electrodes 10s and 10d. As such, there is obtained a double-gated structure with the first gate electrode 40 and the second gate electrode. The double-gated structure makes it possible to decrease the gate voltage. Furthermore, the double-gated structure makes it possible to control the variation in the respective ones of the flexible semiconductor devices when an applied voltage of the second gate electrode is used for modulation purposes.

In each of the above embodiments (e.g., device structure as shown in FIG. 1), the present invention has been described with respect to the flexible semiconductor device wherein the extraction electrode 11s and the source electrode 10s are electrically interconnected via the via 14, and also the extraction electrode 11d and the source electrode 10d are electrically interconnected via the via 14. The present invention, however, is not particularly limited to that. No via 14 is possible. In this case, each of the extraction electrodes 11 (11s, 11d) may extend to the circumferential edge of the insulating film 12 (around the edge of the region 50 shown in FIG. 1(b)), and thereby electrically connecting with the source and drain electrodes 11s, 11d.

INDUSTRIAL APPLICABILITY

Figure 18:
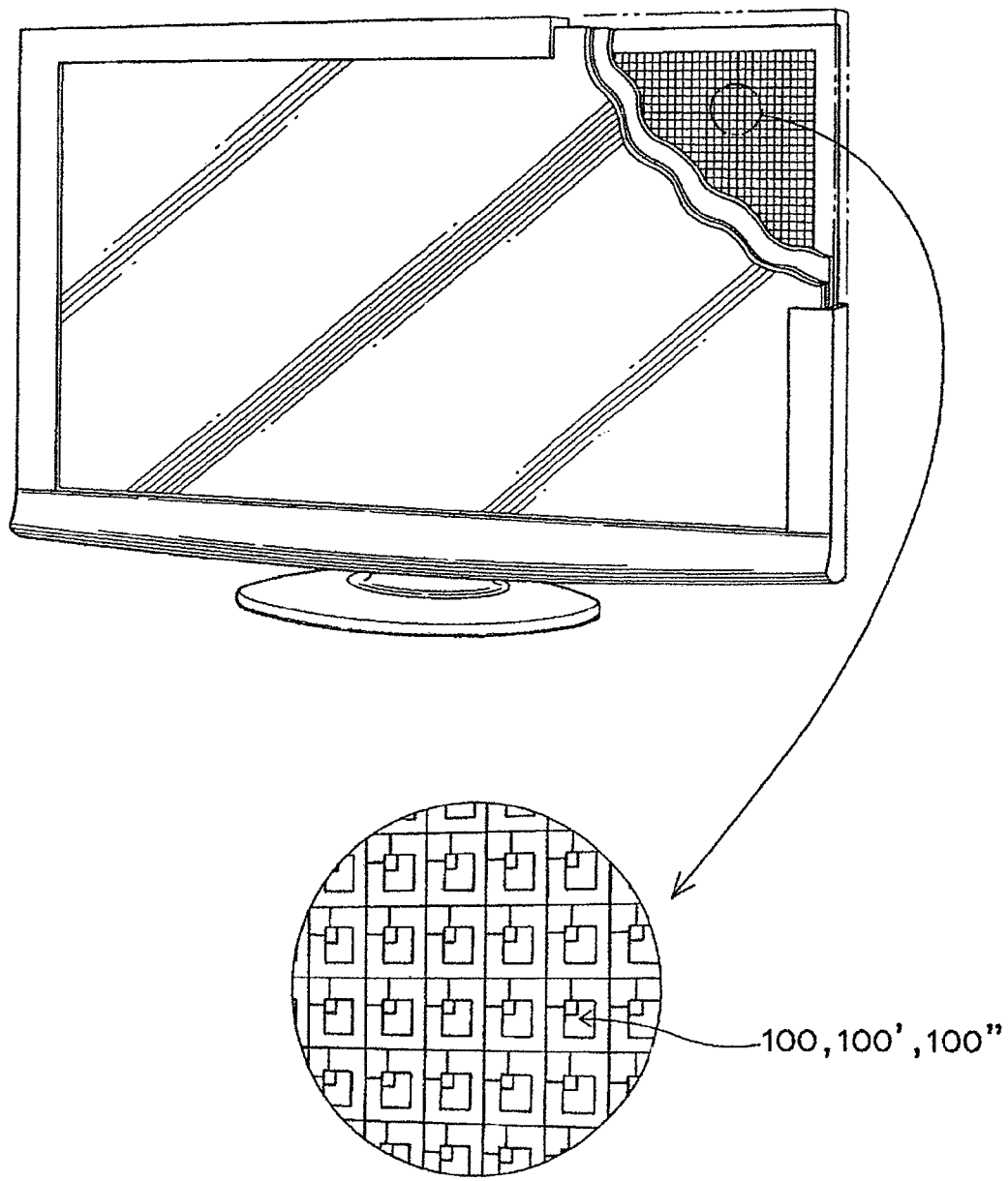
FIG. 18 illustrates an example of a product (an image display part of a television) wherein the flexible semiconductor device of the present invention is used.
Figure 19:
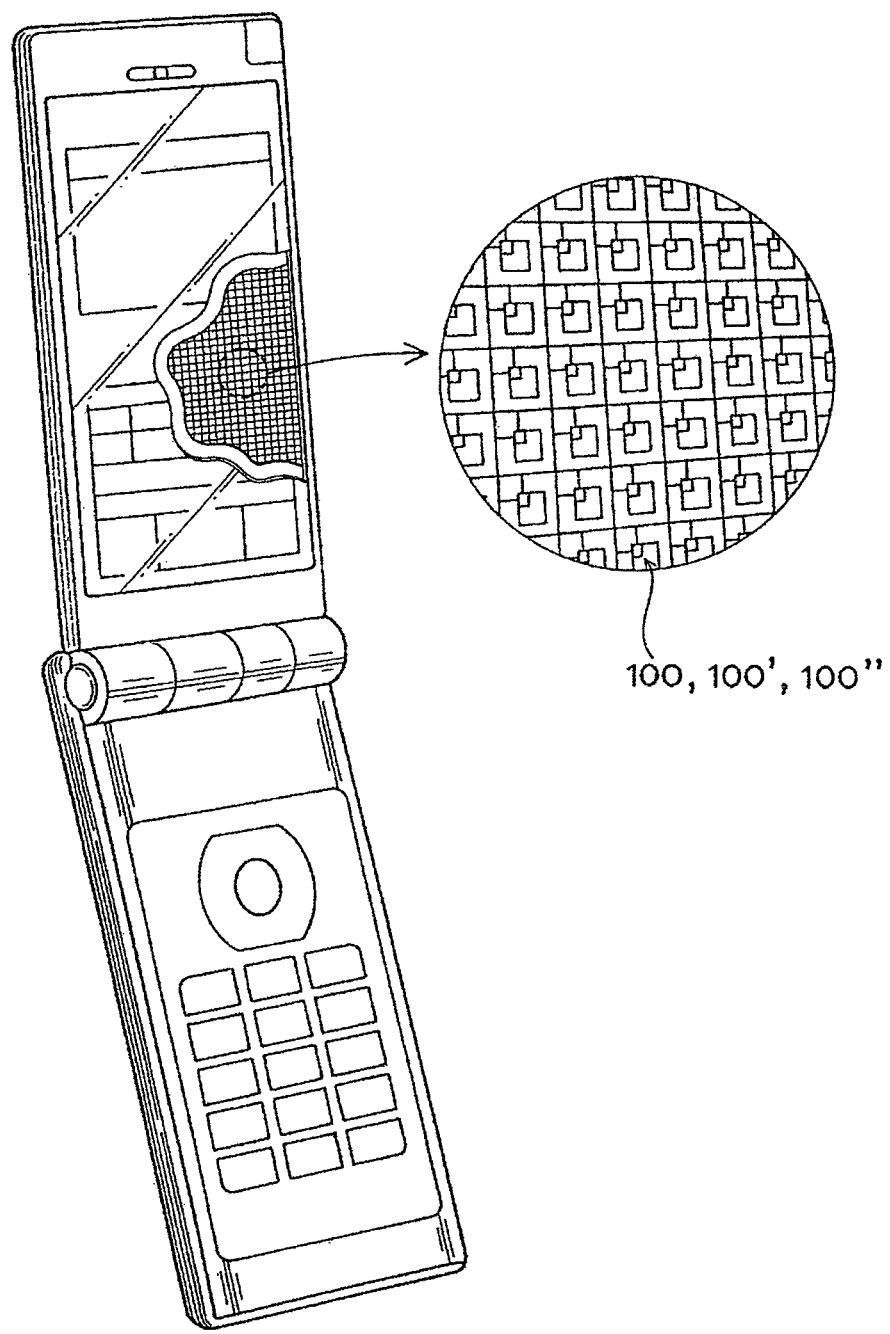
FIG. 19 illustrates an example of a product (an image display section of a cellular phone) wherein the flexible semiconductor device of the present invention is used.
Figure 20:
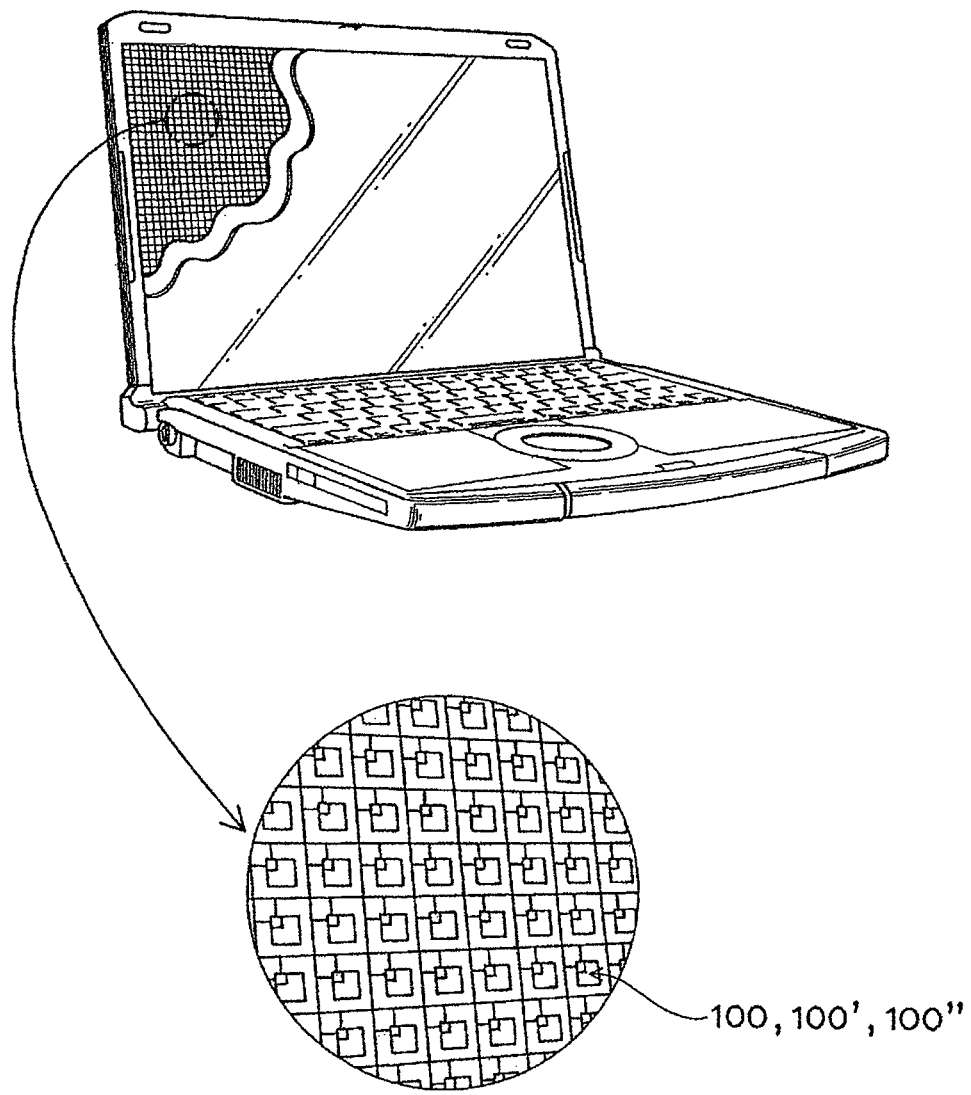
FIG. 20 shows an example of a product (an image display section of a mobile personal computer or a laptop computer) wherein the flexible semiconductor device of the present invention is used.
Figure 21:
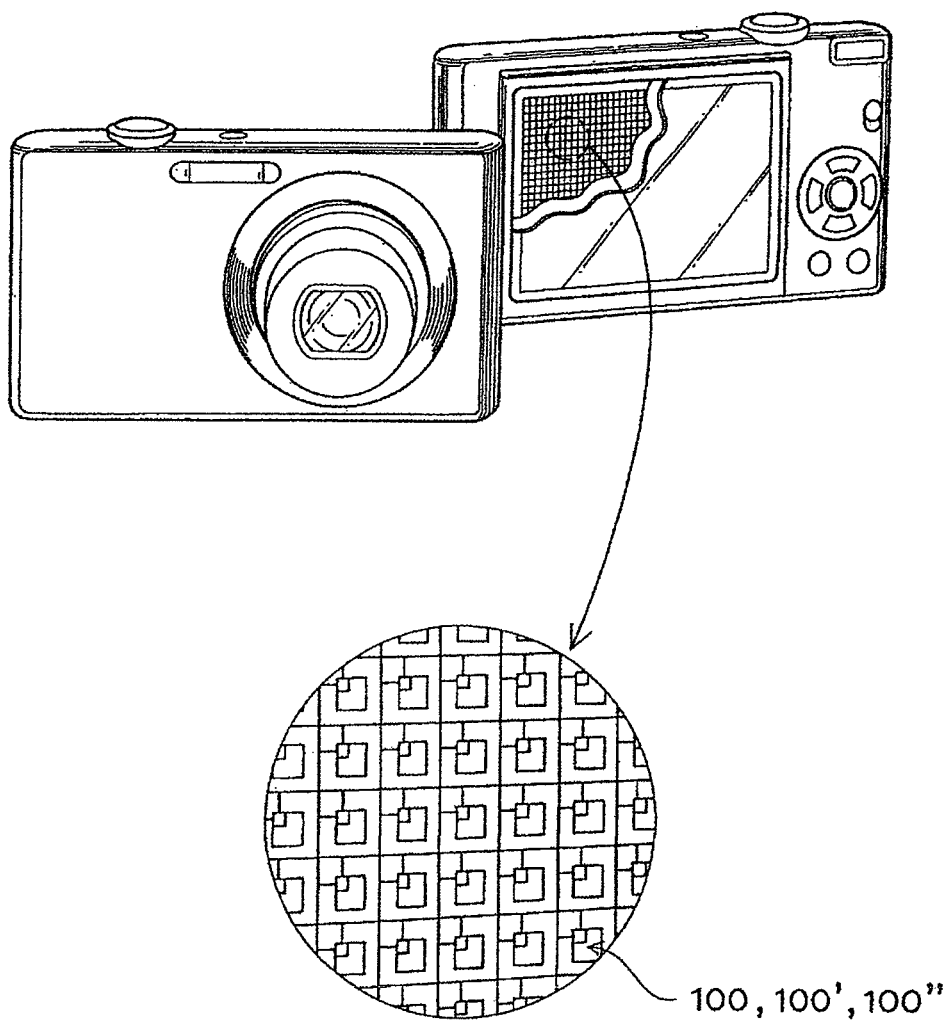
FIG. 21 illustrates an example of a product (an image display section of a digital still camera) wherein the flexible semiconductor device of the present invention is used.
Figure 22:
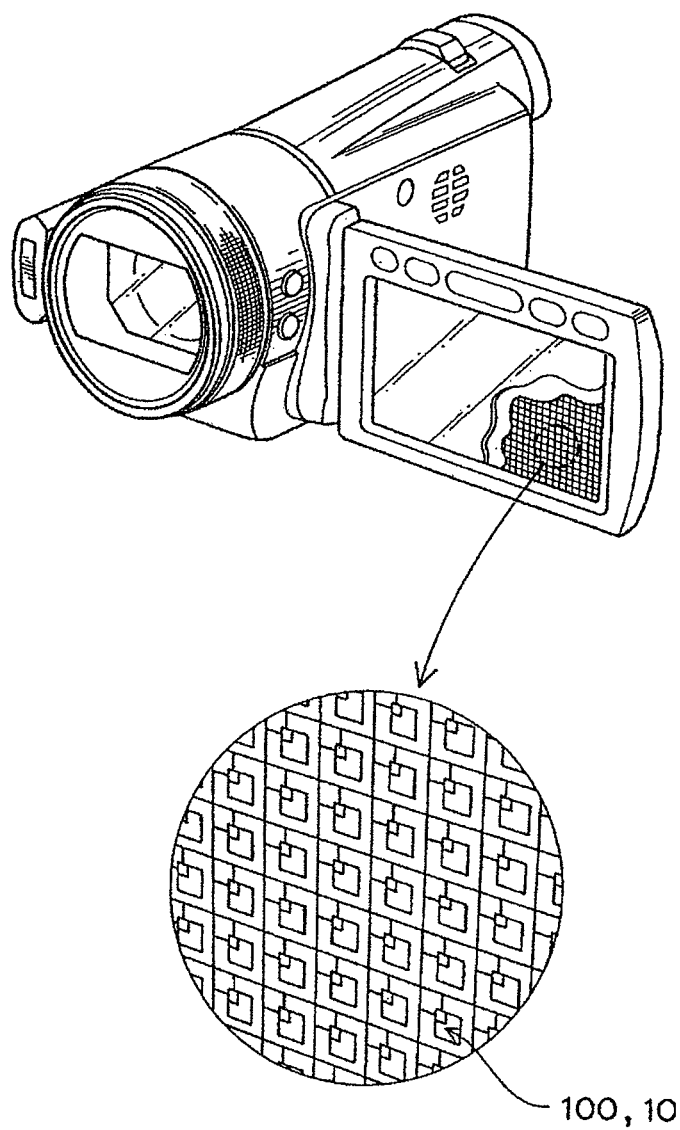
FIG. 22 illustrates an example of a product (an image display section of a camcorder) wherein the flexible semiconductor device of the present invention is used.
Figure 23:
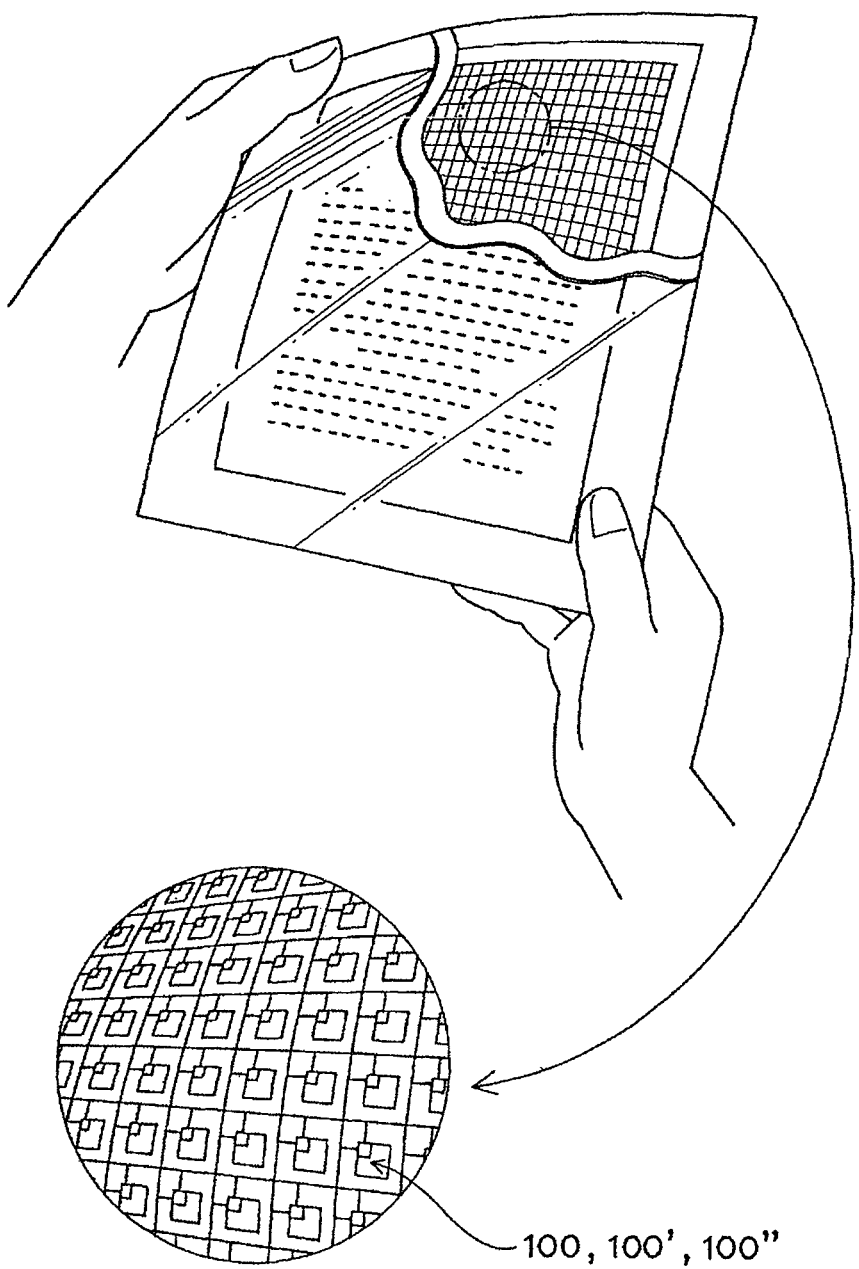
FIG. 23 illustrates an example of a product (an image display section of an electronic paper) wherein the flexible semiconductor device of the present invention is used.

The manufacturing method of the flexible semiconductor device of the present invention is excellent in the productivity of a flexible semiconductor device. The resulting flexible semiconductor device can also be used for various image display parts, and also can be used for an electronic paper, a digital paper and so forth. For example, the flexible semiconductor device can be used for a television picture indicator as shown in FIG. 18, the image display part of a cellular phone as shown in FIG. 19, the image display part of a mobile personal computer or a notebook computer as shown in FIG. 20, the image display part of a digital still camera and a camcorder as shown in FIGS. 21 and 22, the image display part of an electronic paper as shown in FIG. 23 and so on. The flexible semiconductor device obtained by the manufacturing method of the present invention can also be adapted for the various uses (for example, RF-ID, a memory, MPU, a solar battery, a sensor and so forth) which application is now considered to be adapted by the printing electronics.

CROSS REFERENCE TO RELATED PATENT APPLICATION

The present application claims the right of priority of Japan patent application No. 2009-084542 (filing date: Mar. 31, 2009, title of the invention: FLEXIBLE SEMICONDUCTOR DEVICE AND METHOD FOR MANUFACTURING THE SAME), the whole contents of which are incorporated herein by reference.

EXPLANATION OF REFERENCE NUMERALS

10: Support Layer (or Metallic Foil)
10s: Source electrode
10d: Drain electrode
11: Extraction electrode
11s: Extraction electrode for source electrode
11d: Extraction electrode for drain electrode
12: Insulating film
14: Interlayer connecting portion (Via)
15: Via Opening
15a: Formation space for via (Opening)
17: Opening
20: Semiconductor structure portion
22: Semiconductor layer
24: Insulating layer (Gate insulating film)
25: Laser irradiation area in semiconductor layer
30: Resin film
35: Opening (Laser opening)
37: Via
38: Via
40: Electroconductive member (Gate electrode)
50: Region for formation of insulating film
60: Laser irradiation
70A, 70B: Resist (resist layer/resist pattern)
71: Resist (resist layer/resist pattern)
80: Display portion
82: Wiring
85: Capacitor
90: Drive circuit
92: Data line
93: Power source line
94: Selection line
100: Flexible semiconductor device
100A: Flexible semiconductor device
100B: Flexible semiconductor device
100': Flexible semiconductor device
100": Flexible semiconductor device

The invention claimed is:

1. A method for manufacturing a flexible semiconductor device comprising the steps of:
(i) forming a semiconductor structure portion comprising a semiconductor layer on a metal foil;
(ii) forming a resin film on the metal foil such that the semiconductor structure portion is covered with the resin film;
(iii) irradiating the resin film with a laser, and thereby forming an opening in the resin film; and
(iv) forming an electroconductive member such that it comes into contact with an exposed surface of the semiconductor structure portion, said exposed surface being exposed through the opening of the resin film,
wherein the laser irradiation of the step (iii) forms the opening in the resin film, while subjecting the semiconductor structure portion to a heat treatment; and
wherein the laser irradiation of the step (iii) modifies a film quality of the semiconductor structure portion.

2. The method for producing a flexible semiconductor device according to claim 1,
wherein the semiconductor structure portion comprising a semiconductor layer and an insulating layer formed on the surface thereof is formed in the step (i); and
wherein the laser irradiation of the step (iii) additionally subjects the insulating layer to a heat treatment.

3. The method for producing a flexible semiconductor device according to claim 2, wherein a silicon-comprising layer is formed as the semiconductor layer, and a silicon oxide film is formed as the insulating layer.

4. A method for manufacturing a flexible semiconductor device comprising the steps of:
(i) forming a semiconductor structure portion comprising a semiconductor layer on a metal foil;
(ii) forming a resin film on the metal foil such that the semiconductor structure portion is covered with the resin film;
(iii) irradiating the resin film with a laser, and thereby forming an opening in the resin film; and
(iv) forming an electroconductive member such that it comes into contact with an exposed surface of the semiconductor structure portion, said exposed surface being exposed through the opening of the resin film,
wherein the laser irradiation of the step (iii) forms the opening in the resin film, while subjecting the semiconductor structure portion to a heat treatment;
wherein an oxide semiconductor material-comprising layer is formed as the semiconductor layer; and
the laser irradiation of the step (iii) is performed under an oxygen atmosphere.

5. The method for producing a flexible semiconductor device according to claim 1, wherein a pulse laser is used for the laser irradiation of the step (iii).

6. A method for manufacturing a flexible semiconductor device comprising the steps of:
(i) forming a semiconductor structure portion comprising a semiconductor layer on a metal foil;
(ii) forming a resin film on the metal foil such that the semiconductor structure portion is covered with the resin film;
(iii) irradiating the resin film with a laser, and thereby forming an opening in the resin film; and
(iv) forming an electroconductive member such that it comes into contact with an exposed surface of the semiconductor structure portion, said exposed surface being exposed through the opening of the resin film,
wherein the laser irradiation of the step (iii) forms the opening in the resin film, while subjecting the semiconductor structure portion to a heat treatment.
wherein an insulating film is formed on the metal foil; and
the semiconductor structure portion is formed on the insulating film.

7. The method for producing a flexible semiconductor device according to claim 6, wherein the insulating film is formed by oxidizing a surface of the metal foil.

8. The method for producing a flexible semiconductor device according to claim 6, wherein the metal foil is subjected to an etching treatment, and thereby forming a source electrode and a drain electrode therefrom.

* * * * *